(12) United States Patent
Stamness et al.

(10) Patent No.: US 8,977,997 B2
(45) Date of Patent: Mar. 10, 2015

(54) HARDWARE SIMULATION CONTROLLER, SYSTEM AND METHOD FOR FUNCTIONAL VERIFICATION

(71) Applicant: Mentor Graphics Corp., Wilsonville, OR (US)

(72) Inventors: Arthur Jesse Stamness, San Jose, CA (US); Brian Etscheid, Redwood City, CA (US); Randy Misustin, West Linn, OR (US)

(73) Assignee: Mentor Graphics Corp., Wilsonville, OR (US)

( * ) Notice: Subject to any disclaimer, the term of this patent is extended or adjusted under 35 U.S.C. 154(b) by 0 days.

(21) Appl. No.: 13/842,174

(22) Filed: Mar. 15, 2013

(65) Prior Publication Data
US 2014/0282312 A1    Sep. 18, 2014

(51) Int. Cl.
*G06F 17/50*    (2006.01)

(52) U.S. Cl.
CPC .................................. *G06F 17/5022* (2013.01)
USPC ............ 716/106; 716/101; 716/104; 716/136

(58) Field of Classification Search
USPC .......................... 716/100, 101, 104, 106, 136
See application file for complete search history.

(56) References Cited

U.S. PATENT DOCUMENTS

| | | | |
|---|---|---|---|
| 8,219,788 | B1 | 7/2012 | Cheng et al. |
| 2003/0188299 | A1 | 10/2003 | Broughton |
| 2004/0006584 | A1* | 1/2004 | Vandeweerd ................. 709/107 |
| 2004/0098568 | A1 | 5/2004 | Nguyen |
| 2007/0074000 | A1 | 3/2007 | Colwill et al. |

\* cited by examiner

*Primary Examiner* — Naum B Levin
(74) *Attorney, Agent, or Firm* — Dickstein Shapiro LLP

(57) ABSTRACT

Systems and methods of using hardware to simulate software, specifically the semantic operations defined in HDL simulation languages. Traditional software HDL simulation kernel operations of advancing time, activating threads in response to notified events, and scheduling those threads of execution are handled via a simulation controller. The simulation controller is comprised of a timing wheel, an event-processor, a thread/process dispatch engine, a token processor, and a resource-allocator. These components work together with a control logic component to perform the semantic operations of an HDL software kernel.

11 Claims, 25 Drawing Sheets

```
Event[0] : SLIST_TOK(3,0x0)
Event[1] : THREAD_TOK(0x200)
```

Figure 4E

```
SLIST[0] : THREAD_TOK(0x100)
SLIST[1] : THREAD_TOK(0x120)
SLIST[2] : THREAD_TOK(0x140)
```

Figure 4F

```
module test;
   reg    a, b;
   wire   c = a | b ;

initial a = 0;
   initial b = 0;
   initial begin
      #1;
      a = 1;
   end
endmodule
```

Figure 4C

```
test.a:d:0x400000
test.b:d:0x400001
test.c:d:0x400002
initial_a__:i:0x100
initial_b__:i:0x120
initial___0_0_:i:0x140
initial___0_1_:i:0x180
wire_c__   :i:0x200
```

Figure 4D

```
0x100 :  li       $4, 0;
0x104 :  lb.x     $5, 0($a0);
0x108 :  cmp.ne   ?1, $4, $5;
0x10c :  sb.x     $4, 0($a0) if ?1 ;
0x110 :  sw       1, EVENT_SBRD if ?1 ;
0x114 :  term     ;
...
0x120 :  li       $4, 0;
0x124 :  lb.x     $6, 1($a0);
0x128 :  cmp.ne   ?2, $4, $6;
0x12c :  sb.x     $4, 1($a0) if ?2 ;
0x130 :  sw       1, EVENT_SBRD if ?2 ;
0x134 :  term     ;
...
0x140 :  li       $4, THREAD_TOK(0x180) ;
0x144 :  sw       $4, TIME_1 ;
0x148 :  term     ;
...
0x180 :  li       $4, 1;
0x184 :  lb.x     $6, 1($a0);
0x188 :  cmp.ne   ?2, $4, $6;
0x18c :  sb.x     $4, 1($a0) if ?2 ;
0x190 :  sw       1, EVENT_SBRD if ?2 ;
0x194 :  term     ;
...
0x200 :  lb.x     $4, 0($a0);
0x204 :  lb.x     $5, 1($a0);
0x208 :  or       $6, $4, $5;
0x20c :  lb.x     $7, 2($a0);
0x210 :  cmp.ne   ?1, $6, $7;
0x214 :  sb.x     $6, 2($a0) if ?1;
0x218 :  term     ;
```

Figure 4G

| NBA FROM PTR 620 |
| NBA TO PTR 621 |
| EVENT NUMBER 622 | SIZE 623 |

Figure 6D

| SLIST ENTRY-0 624 |
| SLIST ENTRY-1 625 |
| SLIST ENTRY-2 626 |
| ... |
| SLIST ENTRY-N 627 |

Figure 6F

| THREAD PC[31:2] 610 | THREAD SUFFIX[1:0] 611 |

Figure 6A

| EVENT NUMBER[31:2] 612 | EVENT SUFFIX[1:0] 613 |

Figure 6B

| NBA BUF NUMBER[31:4] 614 | NBA SUFFIX[3:0] 615 |

Figure 6C

| SIZE[31:28] 616 | MEMORY OFFSET[27:4] 617 | SLIST SUFFIX[3:0] 618 |

Figure 6E

HARDWARE SIMULATION CONTROLLER, SYSTEM AND METHOD FOR FUNCTIONAL VERIFICATION

FIELD OF THE INVENTION

The present application relates generally to microprocessor operations and architecture, and more particularly, to systems, methods and apparatus for simulating hardware description language.

BACKGROUND OF THE INVENTION

Hardware Description Language or HDL is a specialized computer language used to describe the structure, design and operation of electronic circuits. In general, Hardware Description Language enables precise, formal descriptions of electronic circuits, and is used to automate analysis, simulation, and simulated testing of an electronic circuit. For example, Hardware Description Language is often used to simulate complex circuits such as microprocessors.

Hardware Description Language can be functionally simulated in software. Functional simulation is the use of a computer program to simulate the execution of a second computer program written in a language other than binary machine code. For example, FIG. 1A illustrates a model for functionally simulating HDL designs. According to the model of FIG. 1A, a programmer develops an HDL design 100 to describe an electronic circuit. Using an HDL compiler 101, the HDL design 100 is compiled as a compiled design 102. An HDL simulator 103 is used to simulate the compiled design 102. Simulation of the compiled design 102 is necessary to verify that the HDL design 100 actually performs as intended. Simulation is performed using various software that facilitates a testbench environment. During simulation, a stimulus or input is provided to the compiled design 102 and simulation results 104 are obtained.

Hardware Description Language can also be emulated. While functional simulation relates to the simulating of non-binary machine code, software emulation relates to the simulation of execution of binary machine code. FIG. 1B illustrates a synthesized emulation usage model for emulating HDL designs. According to the model of FIG. 1B, a programmer develops an HDL design 120 to describe an electronic circuit. Using an HDL synthesizer 121, the HDL design 120 is synthesized as a synthesized design 122. An HDL emulator 123 is used to emulate the synthesized design 122. As with the functional simulation model of FIG. 1A, a stimulus or input is provided to the synthesized design 122 and simulation results 124 are obtained.

The models of FIGS. 1A and 1B may be combined in a co-simulation usage model, as illustrated in FIG. 1C, which increases the efficiency of the overall simulation process. In this model, an HDL design 140 is converted into an HDL design 141 that is suitable for emulation and an HDL testbench 147 that is suitable for simulation. The HDL design 141 is subjected to an HDL synthesizer 142 to yield a synthesized design 143. The HDL testbench 147 is subjected to an HDL compiler 148 to yield a compiled testbench 149. The synthesized design 143 is emulated by emulator 144 while the compiled testbench 149 is simulated using HDL simulator 150. The parallel processes of emulation and simulation are linked via a CoSim link 146 which shares information between the two processes, improving the speed of the combined processes. Simulation results 145, 151 are generated from the parallel processes.

Even the co-simulation usage model, however, results in processing inefficiencies. Simulating Hardware Description Language can be problematic, especially on modern PC hardware based on x86 server architectures. In such architectures, Hardware Description Language simulation can be inefficient due to a significant amount of overhead in the representation of the semantic operations of an HDL simulation in the native language. Additionally, inefficiencies arise from managing the processing of the HDL simulation kernel in software. As a result, HDL simulation can be expensive in terms of processor time.

There are many specific reasons for why HDL simulation is slow, especially in x86 server architectures. One reason is that in x86 server architectures, the representation of HDL logical simulation semantics is large, resulting in large bandwidth requirements. Another reason is that cache memory is underutilized due to an abundance of non-repeated actions during, for example, a Verilog simulation. The inability to effectively utilize a memory cache results in slower performance. Another reason for slowness is poor bus effective utilization in an x86 architecture, due to the fixed size of cache lines. Thus, significant mismatches between the number of bytes used and the number of bytes read mean that buses are inefficiently utilized. Additionally, software simulation kernel events and/or scheduling operations are typically not cached well as the ratio of design size to kernel size exceeds 1M to 1.

Therefore, there is a desire to improve and correct the inefficiencies resulting from HDL simulation.

BRIEF DESCRIPTION OF THE DRAWINGS

FIG. 4C is an exemplary Verilog HDL design, in accordance with disclosed embodiments.

FIG. 4D is an exemplary symbol table representing the Verilog design of FIG. 4C, in accordance with disclosed embodiments.

FIG. 4E is an exemplary event table for the Verilog design of FIG. 4C, in accordance with disclosed embodiments.

FIG. 4F is an exemplary Slist memory table for the Verilog design of FIG. 4C, in accordance with disclosed embodiments.

FIG. 4G is an exemplary pseudo-assembly of the instruction memory for the Verilog design of FIG. 4C, in accordance with disclosed embodiments.

FIG. 6A is an exemplary embodiment of a simulation token representing a thread program counter, in accordance with disclosed embodiments.

FIG. 6B is an exemplary embodiment of a simulation token representing an event notification, in accordance with disclosed embodiments.

FIG. 6C is an exemplary embodiment of a simulation token representing an NBA memory region copy, in accordance with disclosed embodiments.

FIG. 6D is a data structure representing the NBA memory copy, in accordance with disclosed embodiments.

FIG. 6E is an exemplary embodiment of a simulation token representing an Slist of simulation tokens, in accordance with disclosed embodiments.

FIG. 6F is an exemplary embodiment of a Slist of simulation tokens, in accordance with disclosed embodiments.

DETAILED DESCRIPTION

Figure 1A:
FIG. 1A is a block diagram of a compiled HDL simulator usage model.
Figure 1B:
FIG. 1B is a block diagram of a synthesized emulation usage model.
Figure 1C:
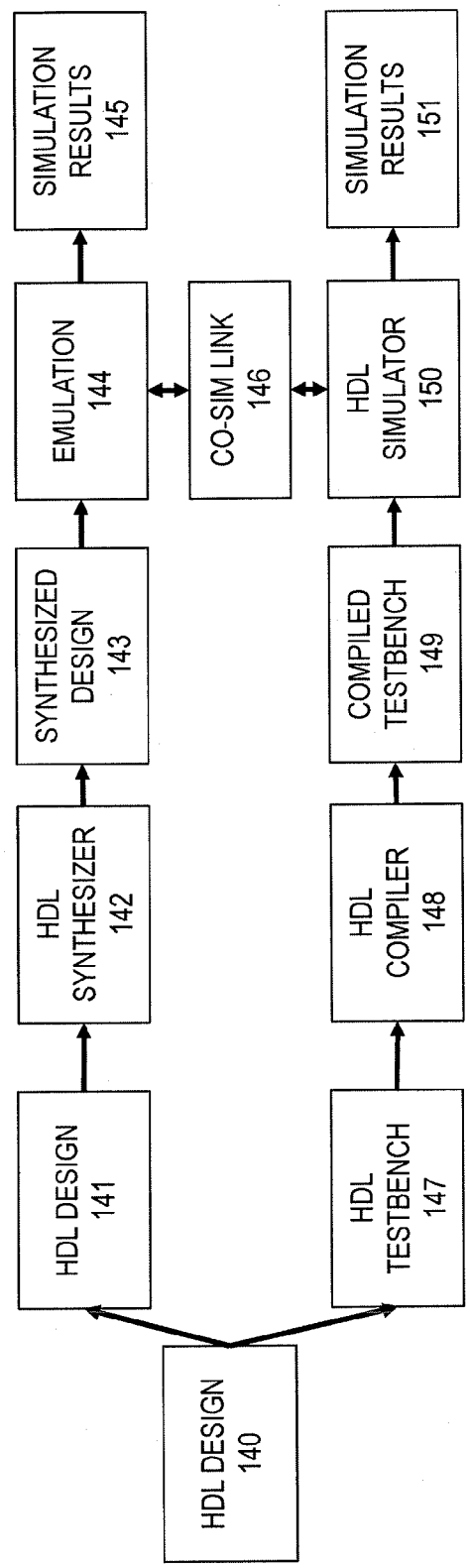
FIG. 1C is a block diagram of a co-simulation usage model.

In the following detailed description, reference is made to the accompanying drawings, which form a part hereof, and in which is shown by way of illustration specific embodiments that may be practiced. It should be understood that like reference numbers represent like elements throughout the drawings. Embodiments are described with sufficient detail to enable those skilled in the art to practice them. It is to be understood that other embodiments may be employed, and that various structural, logical, and electrical changes may be made without departing from the spirit or scope of the invention.

As explained above, the performance of software-based simulation on modern hardware is hampered by various problems including the size of a compiled design representation in memory, poor instruction and data cache performance, poor memory bus utilization, and a software based simulation kernel. One approach to improving application performance of simulating logic circuits and systems can be addressed by a simulation hardware system described in more detail below.

The simulation hardware system addresses the performance limitations of software simulation by replacing the general purpose instruction set encoding of a design with a specialized HDL-optimized instruction set that runs on a custom logic processor. This logic processor operates on HDL simulation datatypes without additional overhead of having to map the HDL simulation semantics operations onto a general purpose processor instructions. The smaller HDL-optimized instruction footprint reduces the amount of time necessary to read the instructions from memory, and therefore reduces the amount of time necessary to perform the simulation.

The simulation hardware system addresses the poor bus utilization of modern CPU's by using multiple smaller memory channels in place of fewer wider channels typical in modern CPU architectures. HDL simulation requires accessing many small 1 byte to 8 byte chunks of data from around a large data address space. Modern CPUs attempt to optimize memory performance for typical CPU software by reading memory one cache-line at a time. These cache lines are typically 64 or 128 bytes in size, which means 1 bit of a Verilog 4-state design value in memory, which theoretically takes up only 2 bits, may require 1024 bits of memory to be read from memory. More narrower interfaces reduce the unused/used data ratio significantly compared to modern CPU architecture.

The simulation hardware system also contains a plurality of memory types, each of which is applied to different memory requirements of a running HDL simulation. HDL design is comprised of many small wire and registers data types, often 1-8 bytes, mixed with some very large data, often many megabytes. HDL design instruction stream is typically comprised of long sequences of instructions that do very few loops. HDL simulation kernel requires less memory than the design data or instructions, but must access the data quickly in order for the simulation to make forward progress. The simulation hardware addresses these conflicting requirements by splitting the memory into separate memory systems, each of which has a custom datapath that is suited for the width of data that is best suited for the particular requirement. SRAM, RLDRAM, and DDR DRAM memories are used for the varying needs for fast access to small data, streaming performance, and massive capacity.

The simulation hardware system addresses the problem of running parallel processes concurrently within a system by memory mapping much of the interaction between HDL design and HDL simulation kernel to memory mapped registers. Memory mapped registers have no software overhead to martial access to physical resources because this is handled by the bus controller at no software cost and with very low latency. Attempting to have every core in a modern CPU attempt to push a value onto a shared software stack would require each core to lock the memory associated with the stack, perform the operation, and then unlock the memory. This would mean that only one core of execution could make forward progress at a time. Memory mapped queues allow the custom logic processors of the simulation hardware system to push values onto memory mapped queues and continue without software level synchronization. This reduces the instructions necessary to perform simulation semantic actions and enables more parallel threads of execution to run concurrently.

The simulation hardware system speeds the performance during low activity of the HDL simulation by always keeping a portion of the next set of simulation time queues or event regions in on-chip queues that are available immediately without going to off-chip memory. Hardware overflow handling allows these queues to be virtually limitless, only constrained by the amount of memory attached to the system.

Finally the simulation hardware system improves the performance during high activity of the HDL simulation by enabling the concurrent processing of the HDL design across many cores whose memory accesses go across memory interfaces designed for their particular memory needs, while, at the same time, the simulation kernel is concurrently accumulating events that are triggered, scheduling threads and processes, and preparing for the next set of operations when simulation time advances.

The simulation hardware described herein is different than past attempts to accelerate using accelerators or emulators in co-simulation with software based simulators. The simulation hardware described herein combines a dedicated low-latency hardware controller that performs the operations of an event-based software simulation kernel with custom logic processors to handle simulation data.

Figure 2A:
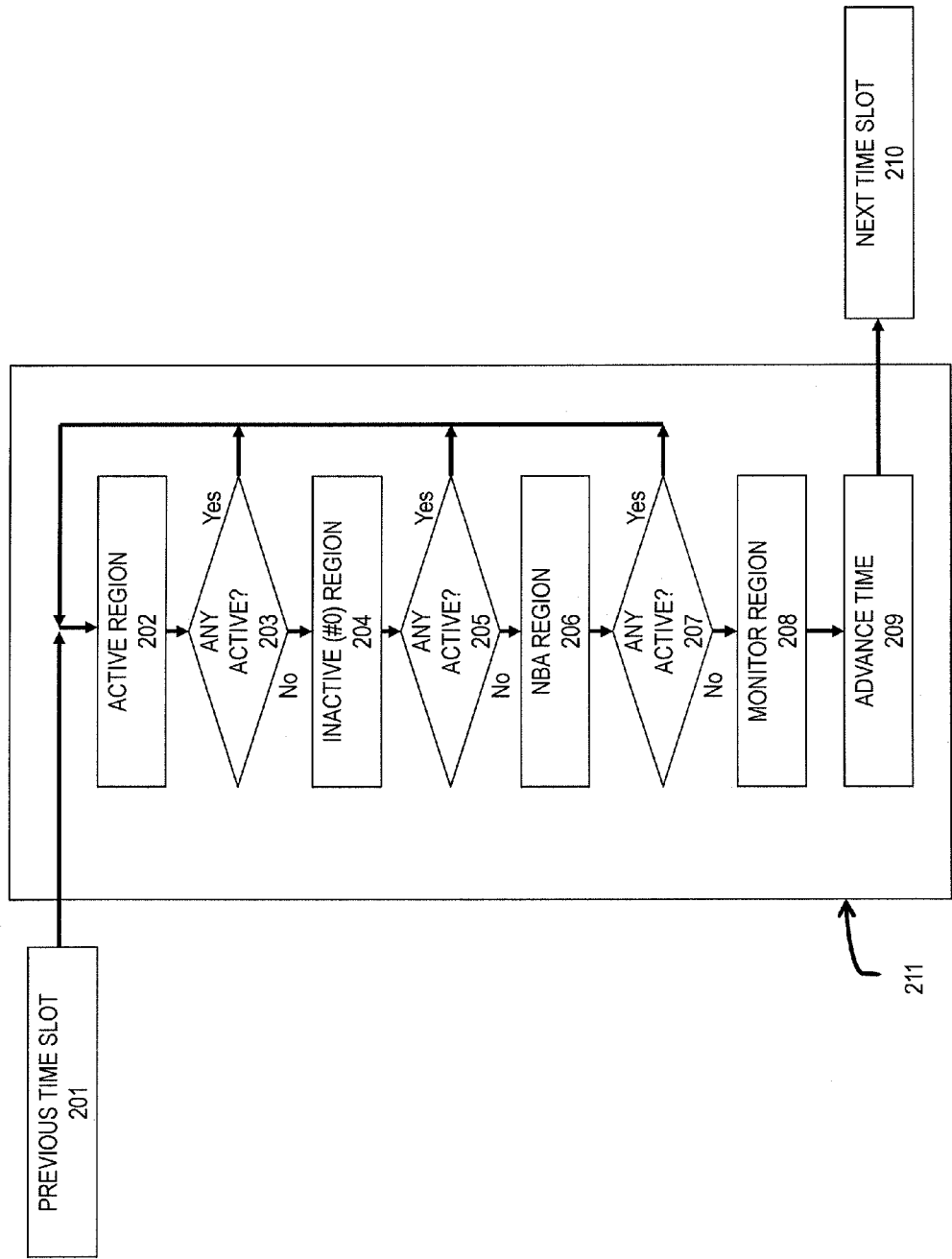
FIG. 2A is a flow chart representing the canonical Verilog event regions.
Figure 2B:
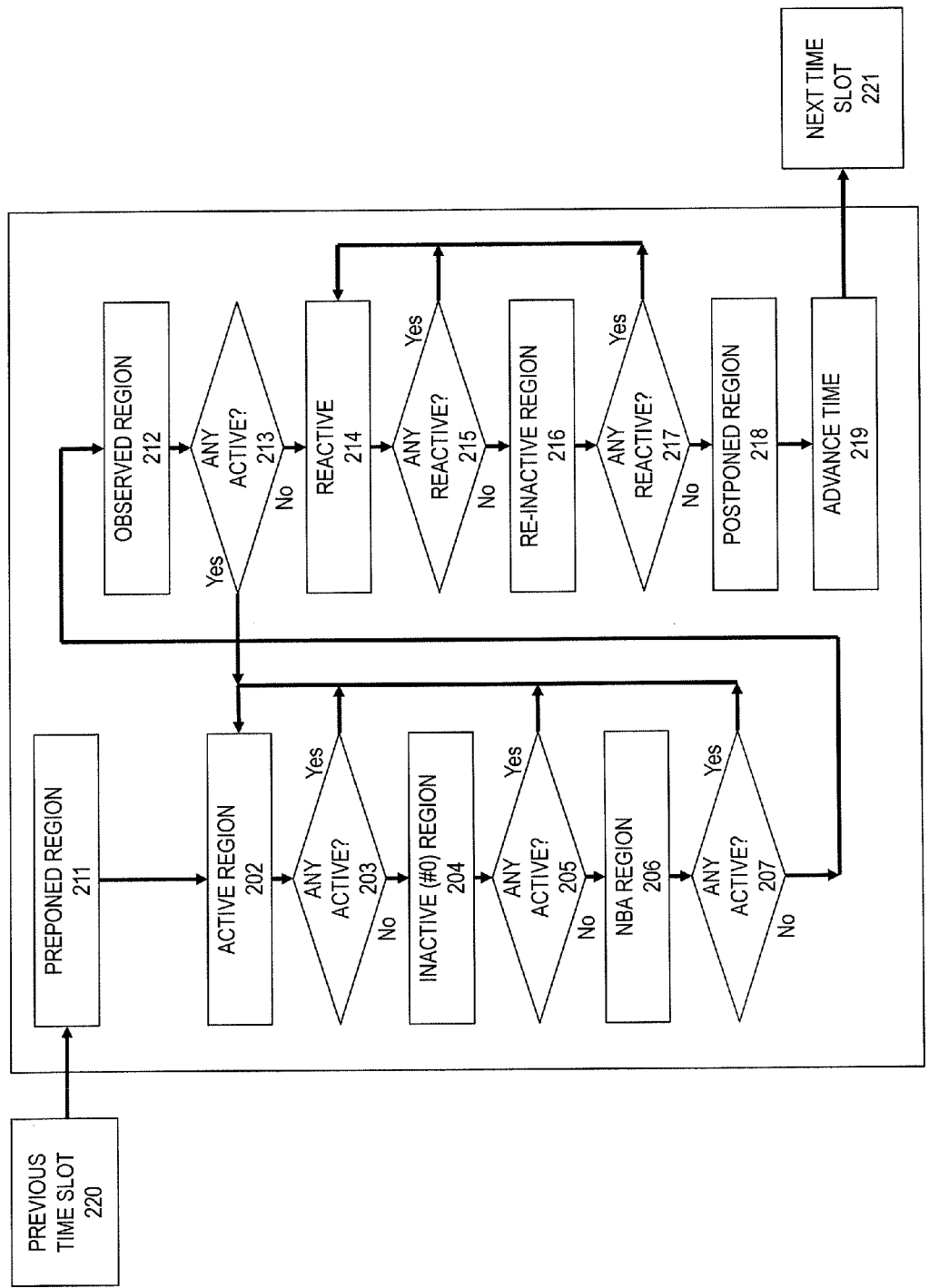
FIG. 2B is a flow chart representing the canonical SystemVerilog event regions.
Figure 2C:
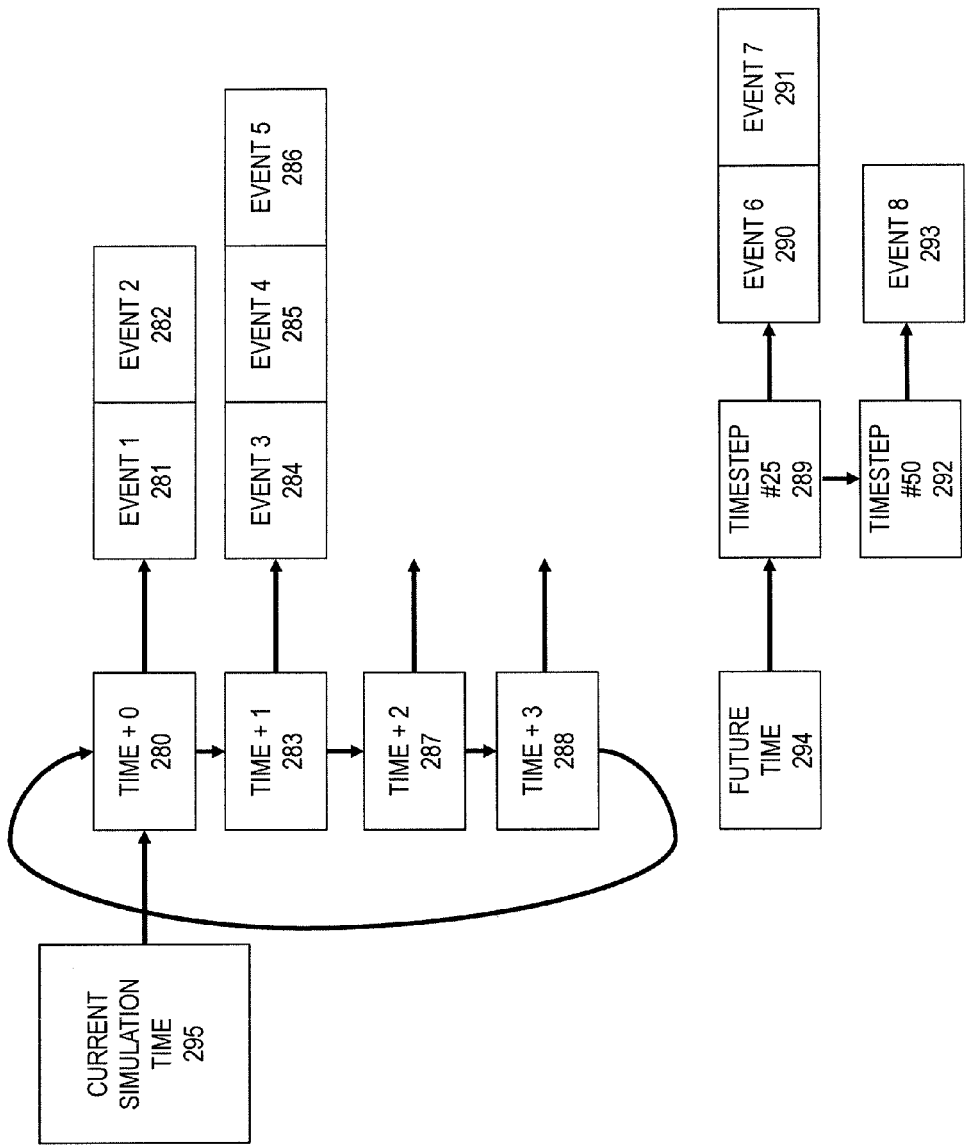
FIG. 2C is a block diagram of a simulation time wheel used in HDL simulation, including a future time queue to hold values outside of a near time wheel's limit.

Event-based software simulation is illustrated generally in FIGS. 2A-C. FIG. 2A is a canonical Verilog event region diagram, where Verilog is an example of an HDL. The diagram of FIG. 2A illustrates that simulation considers how regions of the designed circuit react to events over time. For example, in FIG. 2A, the current time slot 211 is being considered. The previous time slot 201 would have already been analyzed, and analysis of the next time slot 210 will follow. During current time slot 211, various regions of the designed circuit are considered for active threads or processes. Events trigger actions in the form of threads that are scheduled to occur during different even regions. An active region 202 is first considered. If actions exist in response to an event, the actions are further simulated (step 203). Once all actions in the active region 202 are analyzed, inactive regions 204 are analyzed (step 205). Identification of any actions within the inactive regions 204 results in a reanalysis of the active and inactive regions 202, 204. Once all actions in the inactive regions 204 are analyzed, a non-blocking assignment (or NBA) region 206 is analyzed (step 207). Any actions within the NBA region 206 requires a further analysis of the active, inactive and NBA regions 202, 204, 206. When the NBA region becomes active, the actions scheduled to occur during the new region may cause more events to be notified, causing more actions to be scheduled again in the active region. After all previous regions have been executed, the monitor region (step 208) is activated that is used to read the final values of the HDL design for signal tracing, $strobe, or $monitor value changes, and then the time slot is advanced to the next analysis time (step 209).

FIG. 2B illustrates a canonical SystemVerilog event region diagram which is even more complex than the Verilog event region diagram of FIG. 2A. In FIG. 2B, SystemVerilog adds more states in order for better control over the communication of data between a testbench and the device under test. In addition to the process illustrated in FIG. 2A, the SystemVerilog process of FIG. 2B includes additional checks for reactive and re-inactive regions (see, e.g., steps 214-217 of FIG. 2B). The SystemVerilog also considers preponed and postponed regions 211, 218.

FIG. 2C represents a larger picture of the event regions. Each time step in the simulation time wheel Time+0 will need to go through the steps of FIG. 2A before it can go to TIME+1. When a new time step is started the values from the time wheel are placed into the active event queue, and the iteration repeats.

In the presently disclosed embodiments, these functions as illustrated in FIGS. 2A-2C are implemented in a simulation computer system. The disclosed simulation computer system embodies the functionality of a software simulator in hardware on a single chip. In the system, the semantic operations defined in HDL simulation languages (e.g. Verilog, and SystemVerilog) are handled by two different physical processing subsystems.

Traditional software HDL simulation kernel operations of advancing time, activating threads in response to notified events, and scheduling those threads of execution are handled, in the presently disclosed embodiments, on a custom datapath called a simulation controller. As explained in greater detail below, the simulation controller is comprised of a timing wheel, an event-processor, a thread/process dispatch engine, a token processor, and a resource-allocator. These components work together with a control logic component to perform the semantic operations of an HDL software kernel as defined by the stratified event queue model defined for Verilog or SystemVerilog (in FIG. 2A or 2B, respectively).

A set of logic processors runs compiled code generated by an HDL compiler. The system may contain a variety of different logic processor architectures utilizing different instruction set architectures that are more optimized for different portions of the Verilog data model processing. One of the logic processors is designed for fast HDL data manipulation using an HDL logic-optimized processor pipeline capable of manipulating 2-state and 4-state data without additional instruction overhead.

The compiler compiles the design into a series of databases representing the operation semantics of the design. The databases are comprised of symbol table information, design control data, design instruction memory, and design data memory. The symbol tables provide a mapping between the logical elements and the location in the hardware's memory. The design control data contains all the connectivity information stored in a series of tables full of simulation semantic tokens. Simulation tokens are used to represent simulation kernel semantic actions and are run on a custom datapath within the simulation controller. These tokens enable the custom simulation controller to process multiple events simultaneously, allowing the latency to read data from memory to be run concurrently. The design instruction memory contains instructions for the logic processors to execute to manipulate the state of the HDL design elements in accordance with the HDL data semantics. The design data memory contains the starting values for the HDL design data, before the simulation time has begun.

In order to run an HDL simulation using the disclosed embodiments, a compilation is used to produce a design database, and a simulator runs that design database and collects the output. The disclosed embodiments have the same semantic behavior as the software simulator, but have a different operational model. In place of the software simulator, a simulation hardware manager application is used to load the compiled design database into the hardware memory subsystems. The manager then starts the simulation, and then waits (either through polling, or interrupt driver), until the simulation requires servicing. Some example reasons hardware requires servicing from the manager include: displaying output to the screen, reading or writing a file, calling foreign language function call on the PC (that may want to read or write a file or make use of network resources), enabling debuggers, or finishing the simulation.

After the design has been loaded into the hardware, the manager starts the simulation by notifying one event in the "active" event processor scoreboard. This event corresponds to the beginning of time (i.e. "initial" construct in Verilog). Because no components are busy, the event processor performs an iteration by swapping the mapping between the "active" scoreboard and the processing scoreboard, and incrementing the event processor iteration counter. No significant movement of data is performed as part of this operation; only the changing of the register value that is used to map the active and processing event scoreboards to the physical scoreboards in hardware is allowed. After the swap, the "processing" scoreboard contains the event to be processed. The event processor begins reading out bit positions, one at a time, clearing the bits as it goes, until no more events are present. At the beginning of the simulation, this means that the value 0 is read from the scoreboard and the event processor translates this into a memory address of EventTable[0]. The event processor sends the address to the token datapath which will retrieve the value from memory and handle further processing. After clearing the one bit from the event processor processing event scoreboard, the event processor is now idle since there are no more events that have been notified.

The token processor receives the address from the event processor. The token processor reads the address from the simulation memory subsystem, which reads the data from either off-chip memory or on-chip memory depending on the address.

The token processor receives data from the simulation memory subsystem and routes it to the appropriate simulation controller block, based on a token ID. Threads and process tokens are sent to the dispatch engine. Events are sent to the event processor. Slist tokens are converted to memory addresses and placed into memory address queues. This process is repeated until there are no events remaining in the current time step.

The dispatch engine receives the incoming thread token and determines which logic processor this token should be scheduled on. Thread tokens have affinity to a particular core, so a given thread will always run on the same logic processor. Non-blocking assignment (NBA) tokens, which perform the memory copies and event notification during the NBA phase of the event loop, do not have affinity to a particular processor and can be run on any available logic processor. The dispatch engine keeps track of what threads are running so that, in case the same thread becomes active while another invocation of that same thread is still running, the two threads do not run concurrently. This violates the simulation semantics of the HDL language and hardware control is used to prevent this from happening. For thread tokens that are found to be currently running, the dispatch engine places these thread tokens in a cancellation queue which is used to cancel any further attempts to invoke the thread while it is still pending in the cancellation queue. Priority is given to rescheduling tokens out of the cancellation queue over processing new tokens. If the thread token does not match a current running thread token, it is sent to the scheduler. The scheduler schedules the token with a logic processor by writing to the memory mapped program counter register, in case of a thread, or writing to an API register and setting the program counter to an entry from the handler table.

At the completion of the thread or other token processing, the dispatch engine is notified that the logic processor slot is now idle. The scheduler marks the entry in the dispatch engine entry table as being invalid. This would enable the thread to be scheduled again out of the cancellation queue, or make room for another new incoming thread token to takes it position. When all threads are completed the dispatch engine is considered to be idle. The dispatch engine outputs a busy/idle single bit status back to the simulation controller control logic unit.

When all simulation controller sub-blocks are idle, the control logic moves to advance time. If the inactive queue is not empty, this is swapped into the active queue, and the time step register is incremented. Otherwise, if any of the near time queues are not empty, they are swapped into the active queue, and the time register is incremented by the value of the delayed time queue. If none of the near time queues are empty, the future pending register is shifted into the active queue, and the future pending time overwrites the current time.

If all the time queues are empty and there is no future pending register set, then the simulation is complete, and the simulation controller changes state to stopped. The manager puts the hardware into an idle state and the program exits.

Figure 3A:
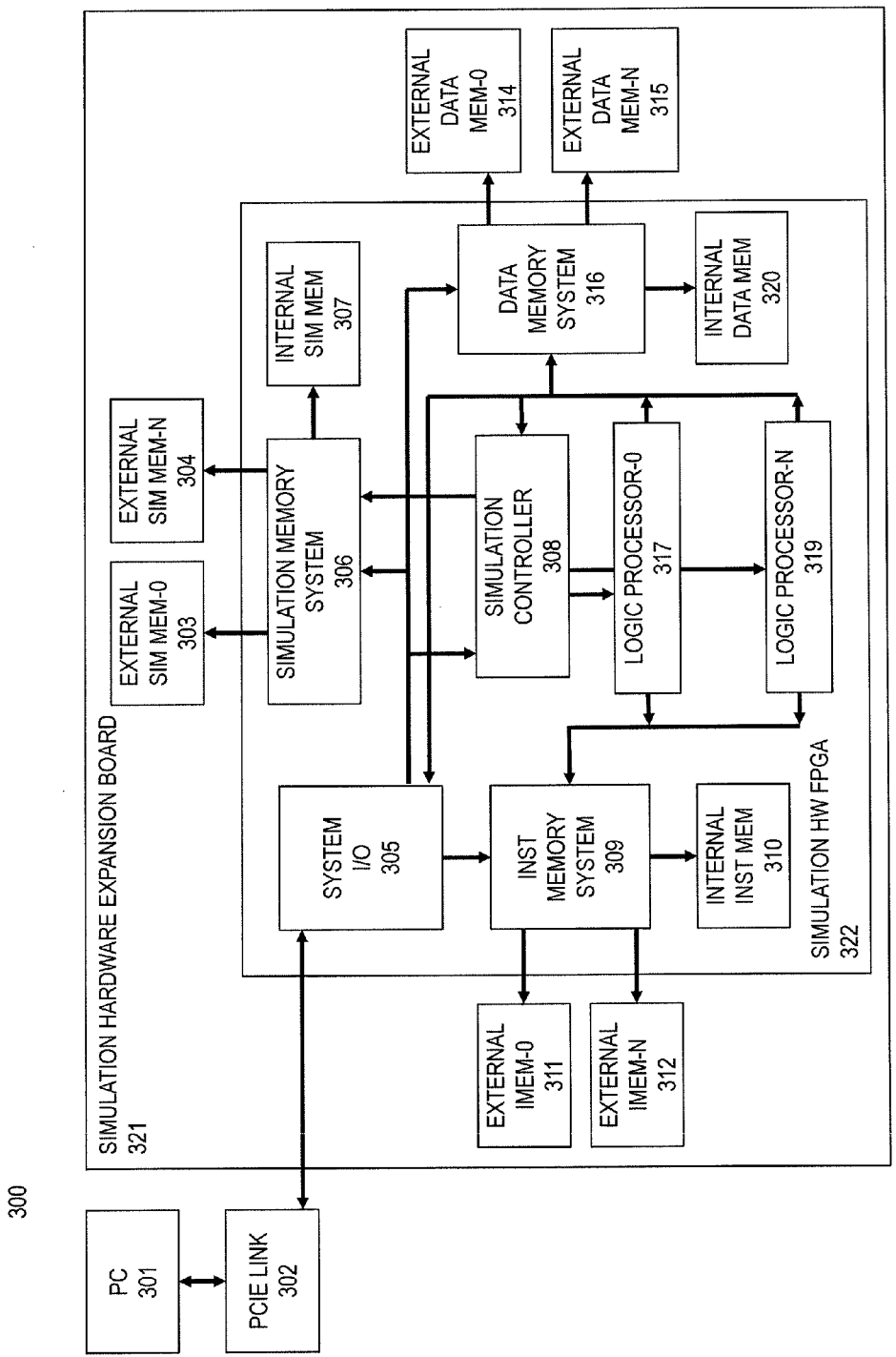
FIG. 3A is a block diagram of simulation hardware in accordance with disclosed embodiments.

In an embodiment, FIG. 3A illustrates a block diagram of a simulation system 300, in accordance with the above description. The system 300 includes a host computer 301 connected over a PCI Express link 302 to a simulation hardware expansion board 321. The simulation hardware expansion board 321 contains a simulation hardware FPGA (or field programmable gate array) 322 and multiple external memory devices 303, 304, 311, 312, 314, 315. Memory devices 303, 304 are external simulation memory devices. Memory devices 311, 312 are external instruction memory devices. Memory devices 314, 315 are external data memory devices. While only two of each type of external memory device is illustrated in system 300, each type of external memory device may be expanded to n memory devices, where n is a positive integer. The external memory devices may also have different speeds. For example, external data memory device 314 may be faster than external data memory device 315. Similarly, external simulation memory device 303 may be faster than external data memory device 304. External instruction memory device 311 may be faster than external instruction memory device 312 because of differences in bandwidth. The memory devices 311, 312 may also have different latencies.

The simulation hardware FPGA 322 contains a simulation controller 308 for performing the semantic operations of an event-driven simulation. Multiple parallel logic processors 317, 319 perform all the logical operations of the simulation and also perform non-latency-critical kernel operations that do not impact performance. The system I/O block 305 is used as the bridge between the PC 301 and the simulation hardware FPGA 322.

The simulation hardware FPGA 322 contains multiple separate address subsystems 306, 309, 316. Instruction memory subsystem 309 interfaces with the external instruction memory devices 311, 312 as well as internal instruction memory 310. Data memory subsystem 316 interfaces with the external data memory devices 314, 315 as well as internal data memory 320. Simulation memory subsystem 306 interfaces with the external simulation memory devices 303, 304 as well as internal simulation memory 307. Some of the data memory devices between different memory subsystem 306, 309, 316 may use the same physical memory components, provided they do not access the same memory addresses.

The instruction memory subsystem 310 is designed to stream multiple long instruction sequences to logic processors 317, 319 from external instruction memory devices 311, 312 and internal instruction memory 310.

The data memory subsystem 316 is designed to handle multiple outstanding read accesses to small amounts of memory. The data memory subsystem 317 stores small design elements which are frequently accessed in internal data memory 320 while placing larger frequently accessed objects in faster external data memory 314. Large infrequently accessed objects are stored in slow external data memory 315.

The organization of the simulation memory subsystem 306 is optimized for different memory fetch behaviors of the simulation controller 308. The data structures of the simulation design are stored across the different external memory devices 303, 304 and internal memory 307 based on compilation heuristics. As with the data memory subsystem 317, the simulation memory subsystem 306 stores data based on its frequency of access. Small frequently accessed data is stored in internal memory 307. Large frequently accessed data is stored off chip in, for example, external memory device 303, which could be SRAM or DDR. Large simulation kernel tables that have predictive memory fetch patterns are stored in external memory device 304, which could be a reduced latency DRAM (RLDRAM).

Figure 3B:
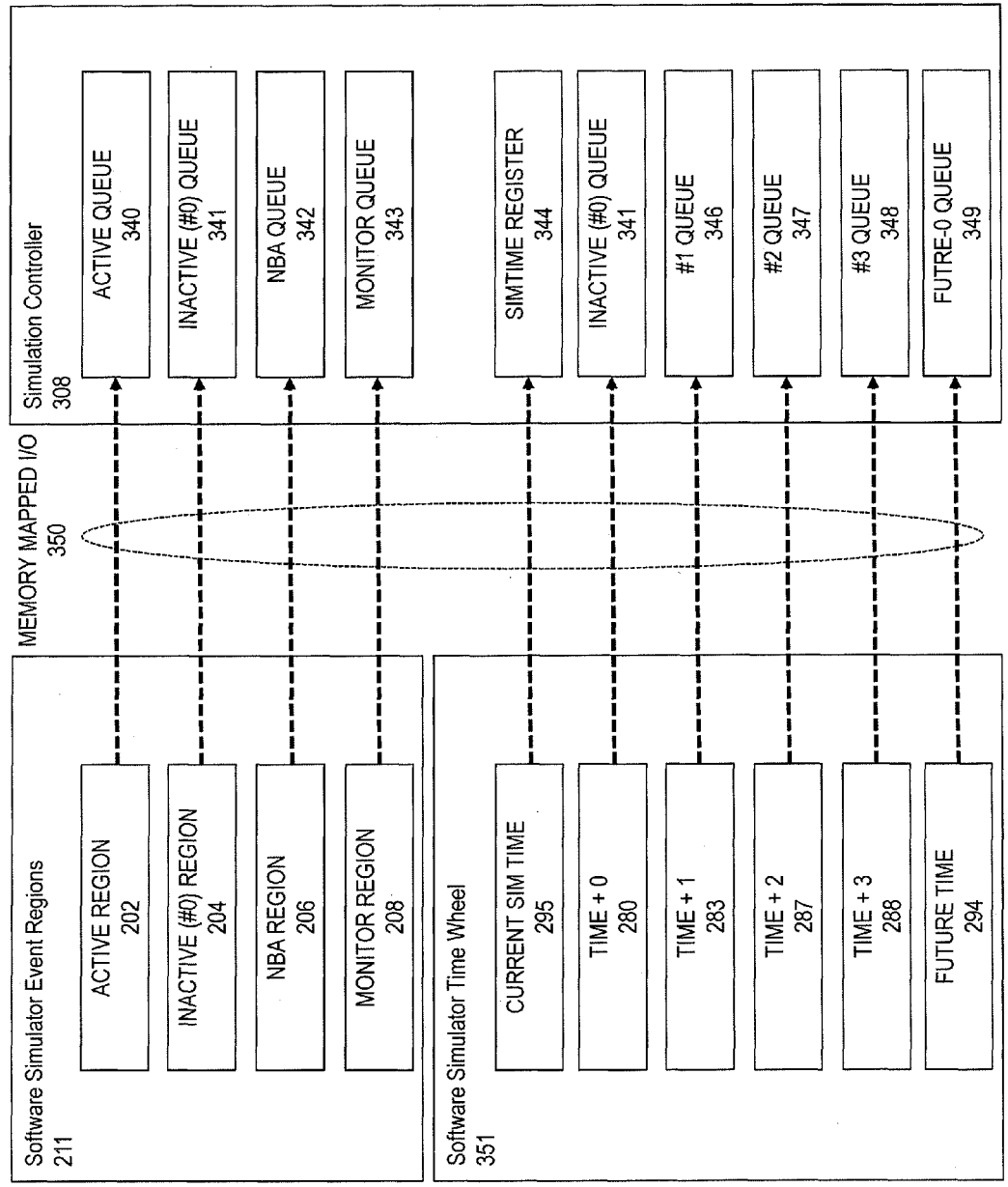
FIG. 3B is a block diagram showing the mapping of software HDL simulator event regions and time wheel queues into physical memory mapped registers of the simulation controller, in accordance with disclosed embodiments.

The simulation controller 308 includes elements that map to the event region diagram of an HDL such as Verilog (as illustrated in FIG. 2A) or SystemVerilog (as illustrated in FIG. 2B) as well as elements that map to a simulation time wheel (such as that illustrated in FIG. 2C). For example, FIG. 3B is a block diagram demonstrating how the components of the event region diagram of FIG. 2A and the simulation time wheel of FIG. 2C are memory mapped onto the simulation controller 308. The semantic queues included in the current time slot 211 of the event region diagram include queues for the active region 202, inactive (#0) region 204, NBA region 206 and monitor region 208, and these map to the active events queue 340, the inactive events (#0) queue 341, the NBA queue 342 and the monitor queue 343, respectively. The semantic queues included in the software simulator time wheel 351 include queues for the current simulation time 295, the time+0 280, time+1 283, time+2 287, time+3 288 and future time 294, and these map to the SimTime register 344, the inactive event (#0) queue 341, the #1 queue 346, the #2 queue 347, the #3 queue 348 and the next nearest future 349, respectively. The mapping is performed via memory mapped I/O 350.

Figure 4A:
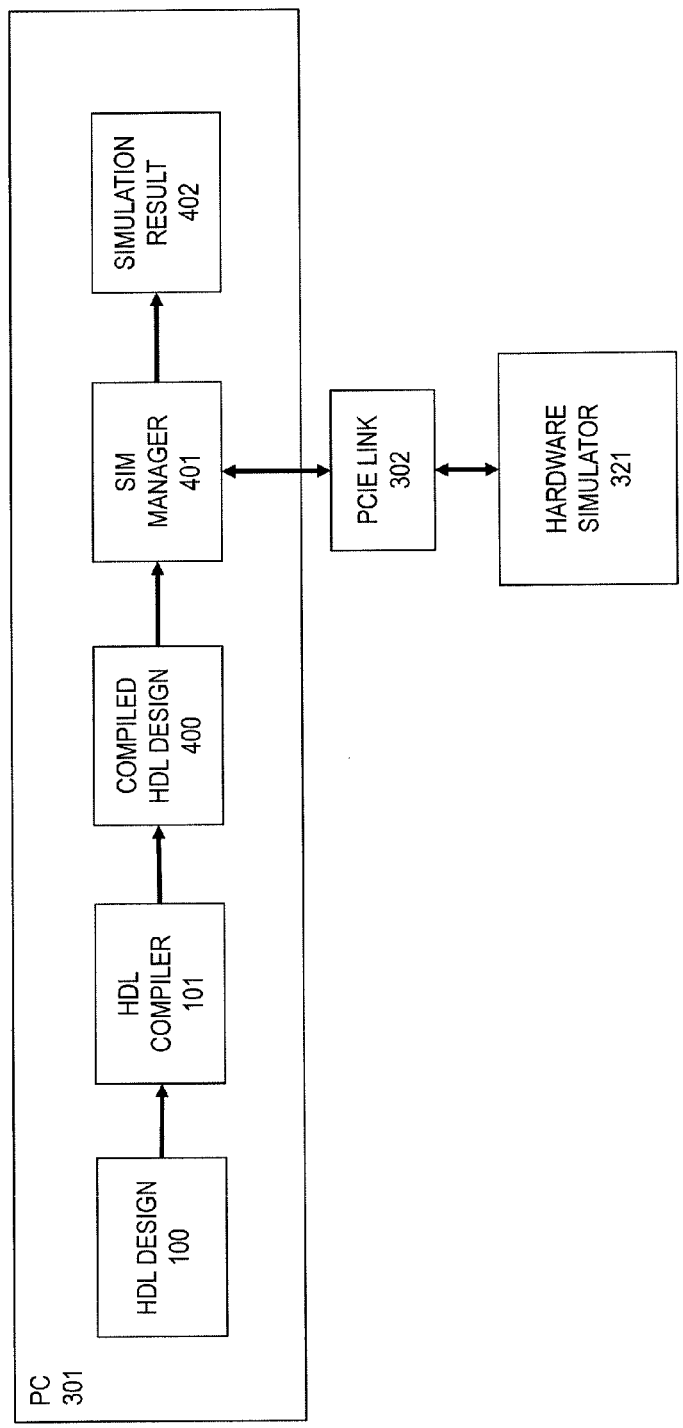
FIG. 4A is a block diagram of the hardware simulation system usage model, in accordance with disclosed embodiments.

FIG. 4A is a block diagram representing a workflow utilizing the simulation hardware expansion board 321. In the illustrated workflow, an HDL design 100 is compiled using an HDL compiler 101 to produce a compiled HDL design 400 within a PC 301. A simulation manager 401 then loads the compiled HDL design 400 into the simulation hardware expansion board 321 via the PCIe link 302. Simulation results 402 are returned from the simulation hardware expansion board 321 to the simulation manager 401, which produces the results. Simulation results 402 are produced in the form of output files, signal tracing logs, and coverage data, for example.

Figure 4B:
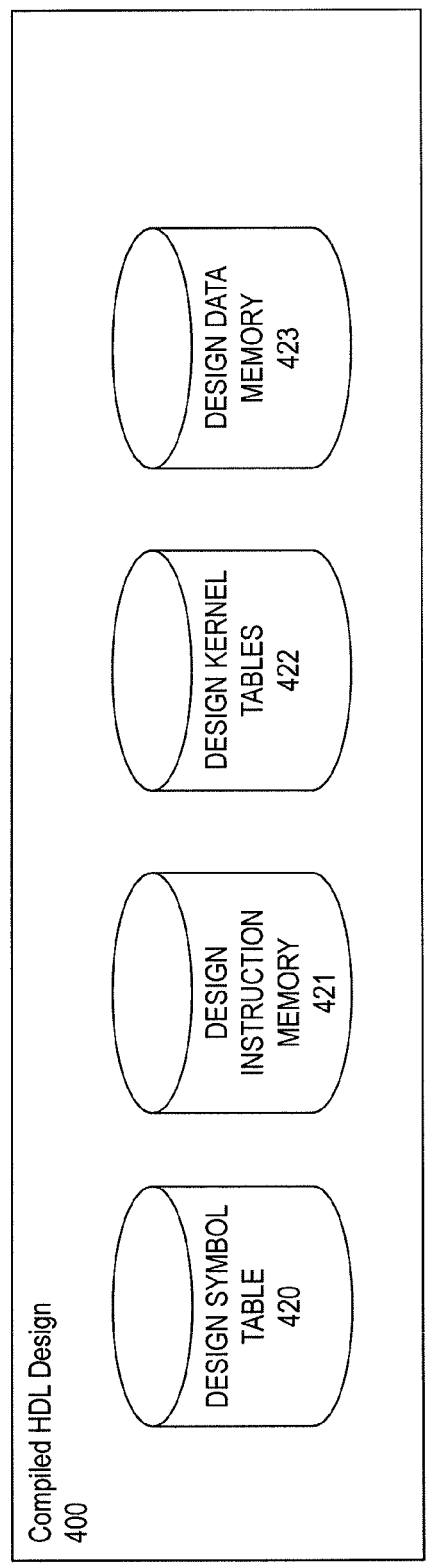
FIG. 4B is a block diagram of the components of a compiled HDL design output from the compiler, in accordance with disclosed embodiments.

The compiled HDL design 400 of FIG. 4A is illustrated with greater detail in FIG. 4B. FIG. 4B represents a block diagram of the components of the compiled HDL design 400. These components include a design symbol table 420, design instruction memory 421, design kernel tables 422, and design data memory 423. The design symbol table 420 represents an HDL design, with each line of the table indicating a symbol for a component in the design. The design instruction memory 421 stores the instructions for simulation of components in the design. The design kernel tables 422 represents the simulation process used to simulate the design, and the design data memory 423 stores the input, output and generated data used during simulation. Each of these is described in greater detail below in the context of an example illustrated by FIGS. 4C-4G. However, because an understanding of the example requires further explanation of various other components, a description of the example and FIGS. 4C-4G will occur after additional components of the disclosed embodiments have been described.

Figure 5A:
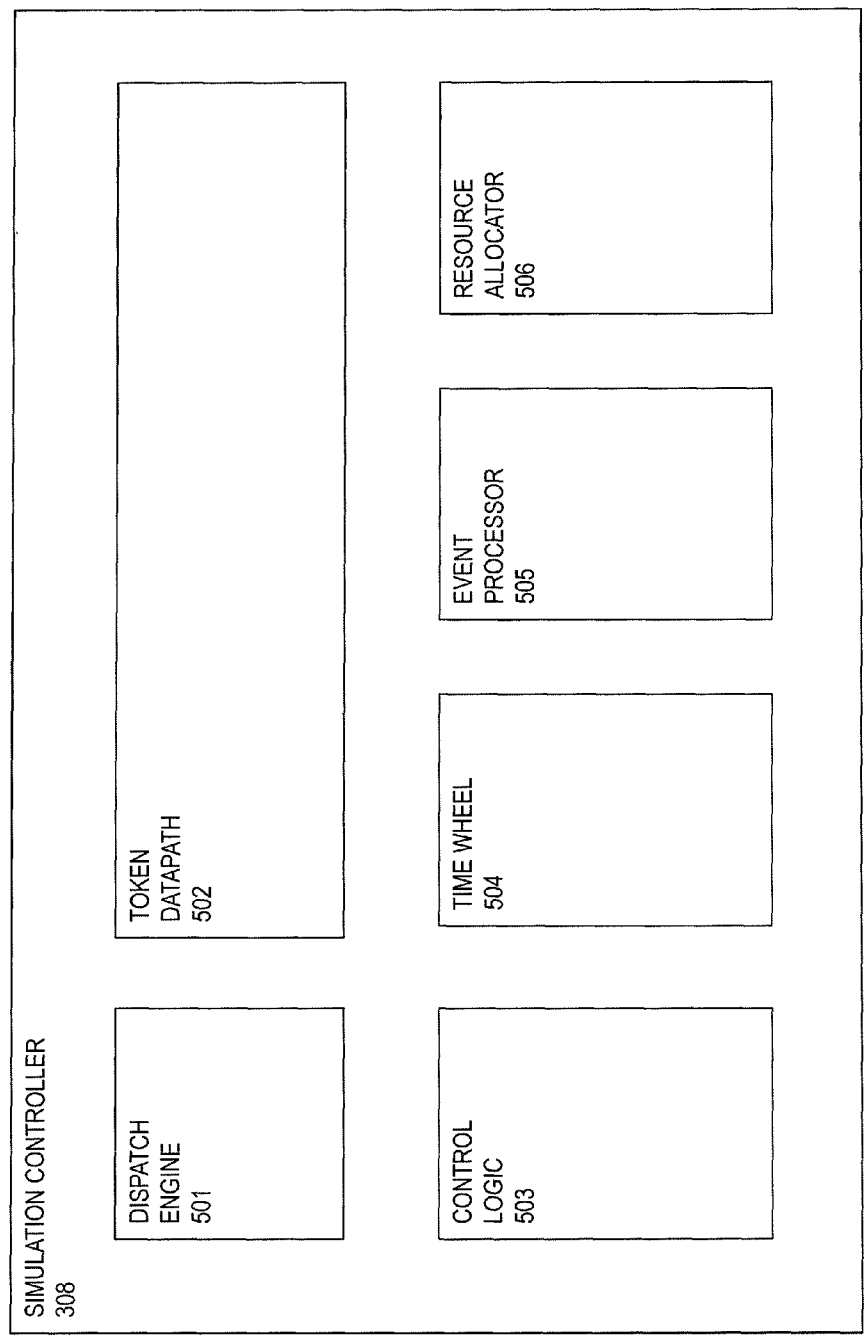
FIG. 5A is a more detailed block diagram of the simulation controller components, in accordance with disclosed embodiments.

FIG. 5A is a block diagram of the components of the simulation controller 308. A dispatch engine 501 manages the logic processor resources and is responsible for scheduling tokens on available processors, as well as keeping track of when a token is complete so the resource can be made available again. A token datapath 502 collects simulation memory addresses of tokens that need to be processed, reads the tokens from memory, and routes the token to the appropriate simulation controller component. A timing wheel 504 contains the timing wheel queues and event regions (as identified in FIG. 3B) and holds both active and delayed threads while the threads wait for an available logic processor slot or wait for the simulation time to advance in order to move them to the active queue. An event processor 505 contains the scoreboards. Scoreboards store the notified events in an efficient and compact format. A resource allocator 506 contains scoreboards which are used to allocate memory resources required by other components of the simulation controller 308 and by software running on logic processors 317 and 319. The components of the simulation controller 308 are explained in greater detail below.

Figure 5B:
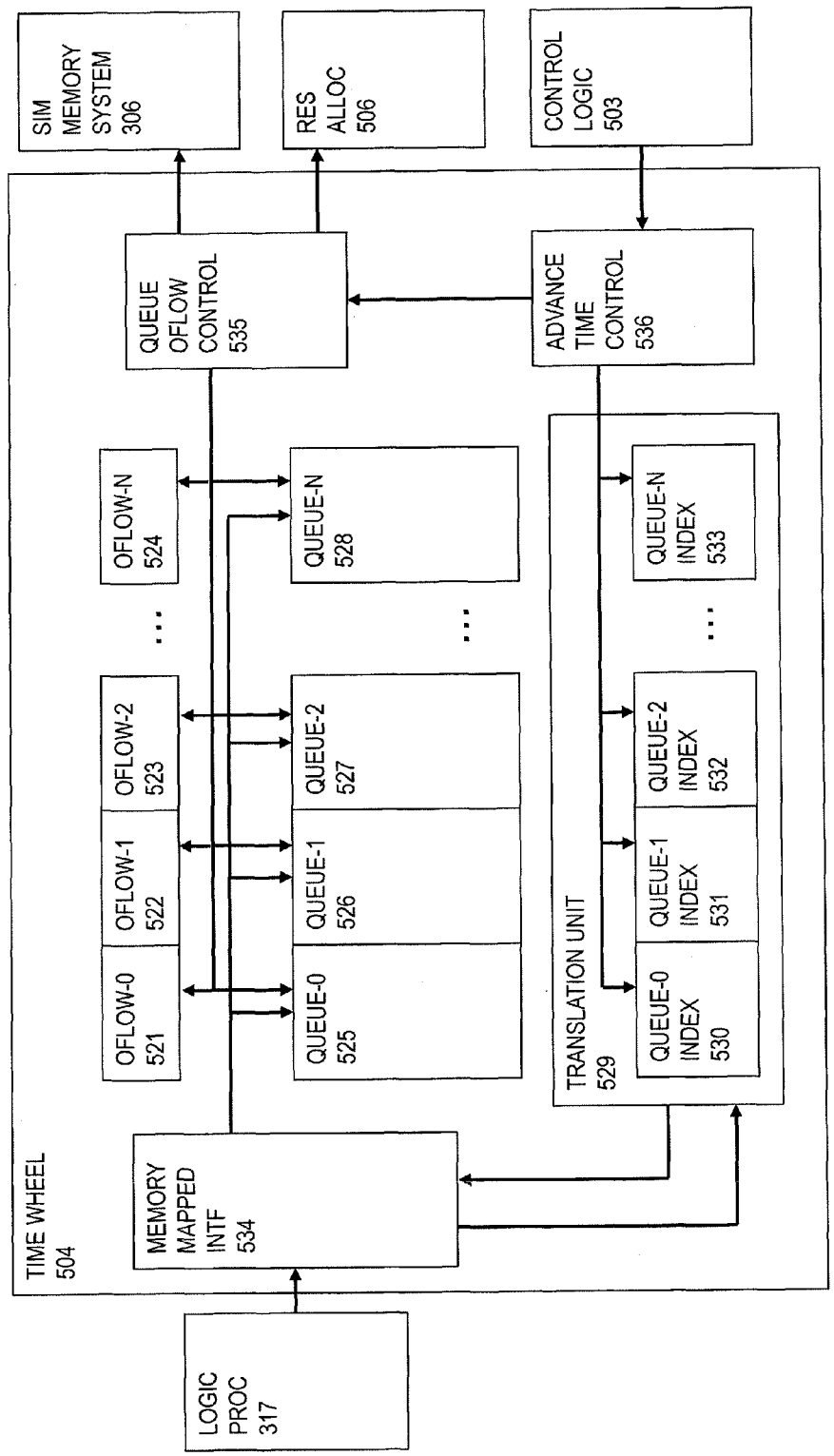
FIG. 5B is a more detailed block diagram of the timing wheel and event region components, in accordance with disclosed embodiments.

FIG. 5B illustrates a block diagram of the time wheel 504. The time wheel includes physical queues to which the memory mapped queues identified in FIG. 3B are mapped and with which the simulation memory subsystem 306 interfaces. The time wheel 504 also includes a memory mapped interface 534 which enables other components of the simulation controller 308 or software running on logic processors 317 and 319 to manipulate the queues in the time wheel 504. The queues 525, 526, 527, 528 can be configured to operate in FIFO order or in LIFO (stack) ordering. The queue overflow controller 535 prevents queues from overflowing and losing data. When a queue, configured as a stack, e.g. Queue-2 527, is filled above a threshold value, the queue overflow controller 535 requests a block of memory to spill data to. The queue overflow controller 535 request is made to the resource allocator 506 (of FIG. 5A). The memory mapped scoreboards of the resource allocator 506 return a value which represents a segment of memory that can be utilized. Reading the value from the resource allocator 506 scoreboard is in effect allocating a memory resource. The pointer to spilled memory is stored into overflow Queue-2 register 523. Each queue 525, 526, 527, 528 has an associated overflow queue register 521, 522, 523, 524, respectively. When the number of entries in the queue drops below the threshold value, the queue overflow controller 535 returns the data back from memory into the queue. When all data has been returned, the overflow queue controller 535 writes back the data to the resource allocator 506 scoreboard, in effect returning the memory resource.

The translation unit 529 of the time wheel 504 is used to reduce the effort in moving between queues of the simulation event regions, as described with reference to FIG. 2A. The translation unit 529 contains an array of queue indices 530, 531, 532, 533 which translate the memory mapped queues in FIG. 3B to the physical queues 525, 526, 527, 528 in the time wheel 504. The queue indices 530, 531, 532, 533 also generate a series of empty or non-empty status bits corresponding to the memory mapped queues, for use by the control logic block 503.

In order to simulate the advancement of time, an advance time control block 536 is used to write to the array of queue indices 530, 531, 532, and 533 when issued a command to do so by the control logic 503. Time advancement is simulated by changing the physical queue 525, 526, 527, 528 to which a memory mapped queue is mapped.

Figure 5C:
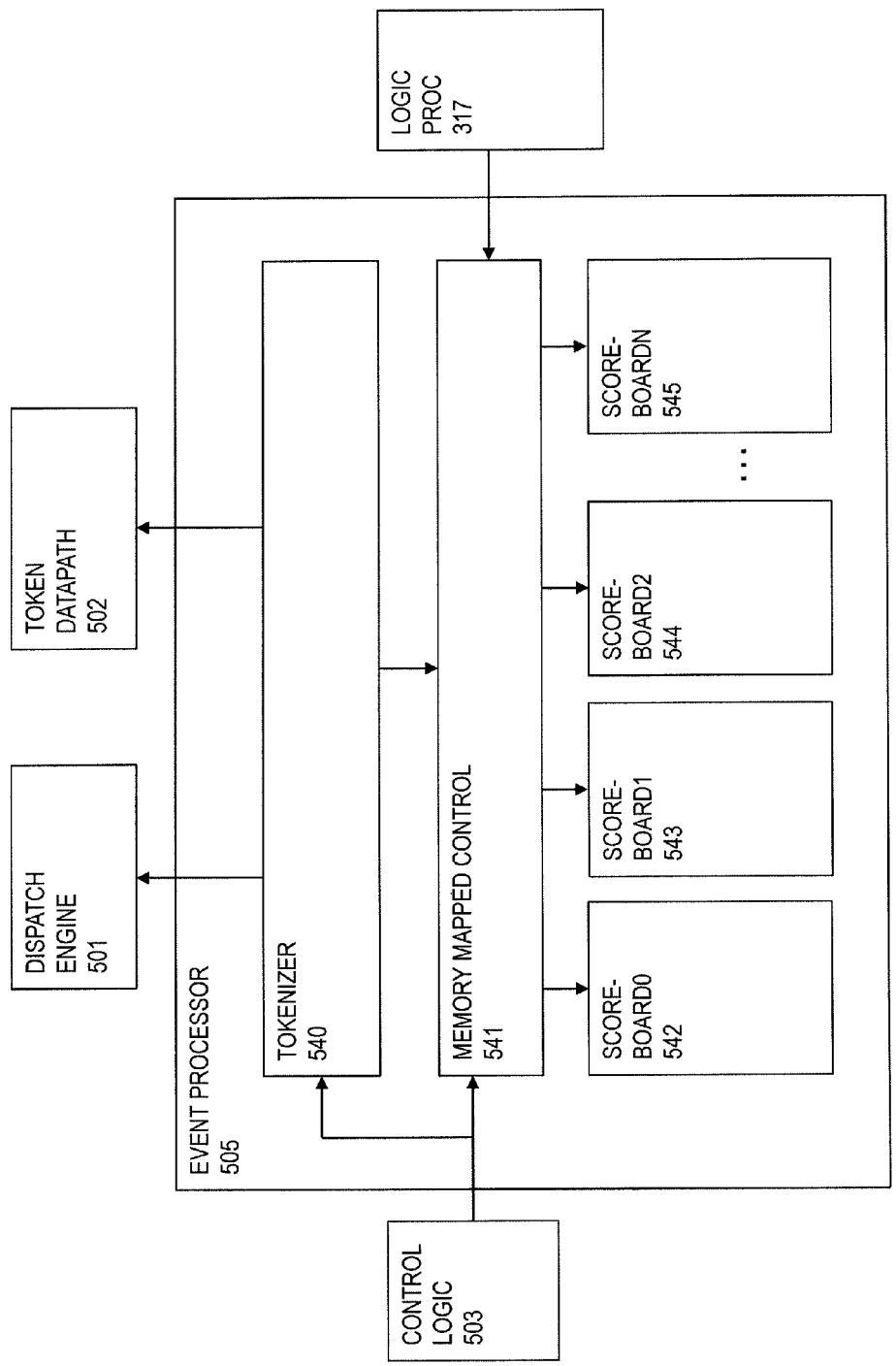
FIG. 5C is a more detailed block diagram of the event processor components, in accordance with disclosed embodiments.
Figure 8:
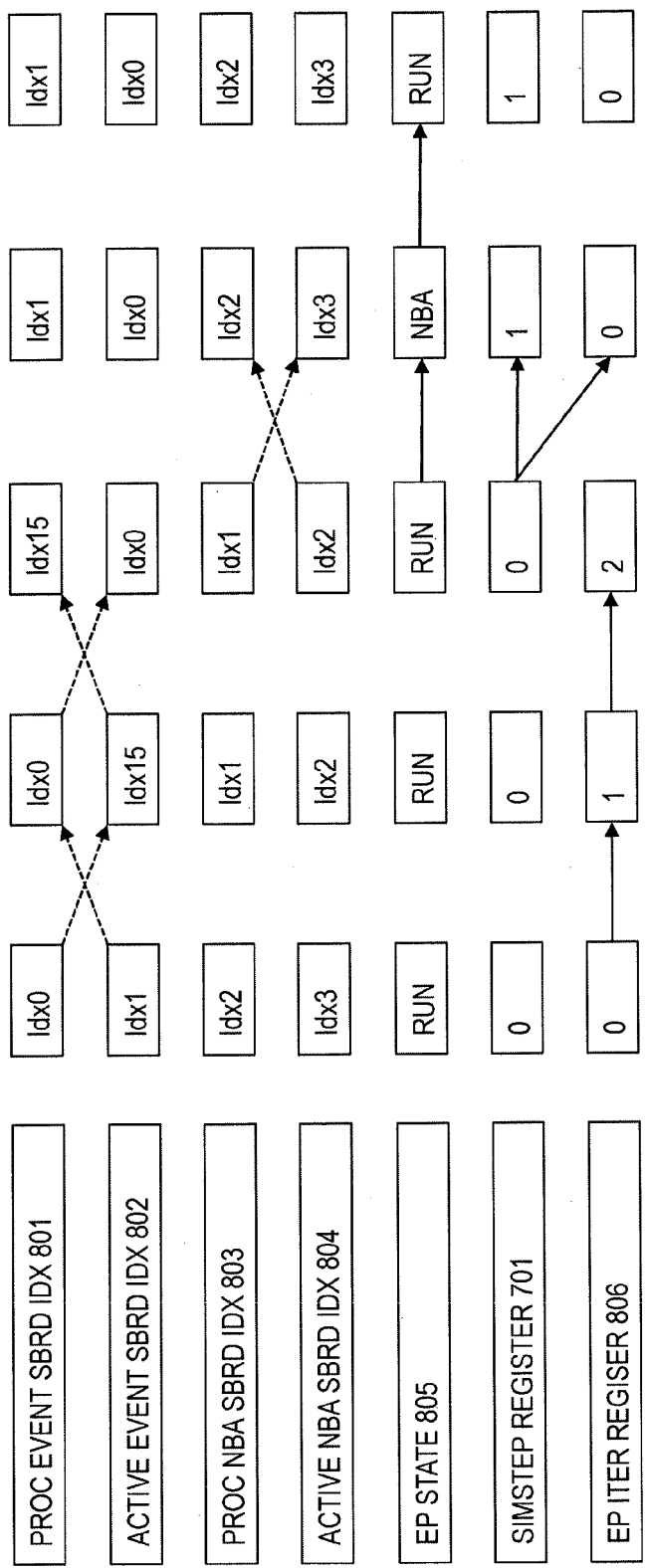
FIG. 8 is a timeline of the register values of the event processor during iterations, and as time advances, in accordance with disclosed embodiments.

FIG. 5C is a block diagram of the event processor 505. The event processor 505 includes an array of physical scoreboards 542, 543, 544, 545. The memory mapped control 541 includes an array of index registers which map the memory-mapped scoreboards of the event processor 505 to the physical scoreboards 542, 543, 544, 545. The tokenizer 540 reads an index of set bit values from a processing scoreboard and converts them into tokens or memory addresses dependent upon a state of the event processor (or the EP state 805, as illustrated in FIG. 8). The event processor 505 can have either an EP state of "RUN" or "NBA." When the EP state is "RUN," the tokenizer 540 reads an index of set bit values from the scoreboard indicated by a processing event scoreboard index register 801 and converts the number into an address offset of the event table which is sent to the token datapath 502. When the EP state is "NBA," the tokenizer 540 reads from the scoreboard indicated by a processing NBA scoreboard index register 803 and converts the number into an NBA buffer token which is then sent to the dispatch engine 501. The tokenizer 540 always clears the bits as they are read from the scoreboard so that when every bit has been read the scoreboard is left empty.

The scoreboards 542, 543, 544, 545 can be implemented such that external memory is used to keep track of the bits set. The scoreboards 542, 543, 544, 545 can also be implemented such that some range of scoreboard entries are stored in on-chip memory, while other ranges of scoreboard entries are stored in external memory resources. The scoreboards 542, 543, 544, 545 can also be implemented such that they return an offset and an array of set bits, effectively giving a set of bits instead of one bit at a time. This embodiment of the scoreboard would enable the tokenizer 540 to request a larger block of data from the token datapath 502 without requiring multiple cycles to determine memory proximity.

The event processor 505 also implements clock suppression tables. Software HDL compilers, in an attempt to improve performance, have determined that significant amounts of logic that are sensitive to the edge of a clock, may not need to be evaluated unless the inputs to that block have changed since it was last evaluated. See, e.g., U.S. Pat. No. 8,311,781 (entitled "Selectively reducing the number of cell evaluations in a hardware simulation"), issued on Nov. 13, 2012, the entirety of which is herein incorporated by reference. Scoreboards are an ideal storage for containing the information about which logic must be evaluated as a result of a clock edge.

The simulation controller 308 may also be implemented to contain multiple event processors 505 for converting scoreboards into token addresses or tokens. The event processors 505 may also be implemented as having multiple data paths, each capable of reading from a given grouping of scoreboards in parallel.

Figure 5D:
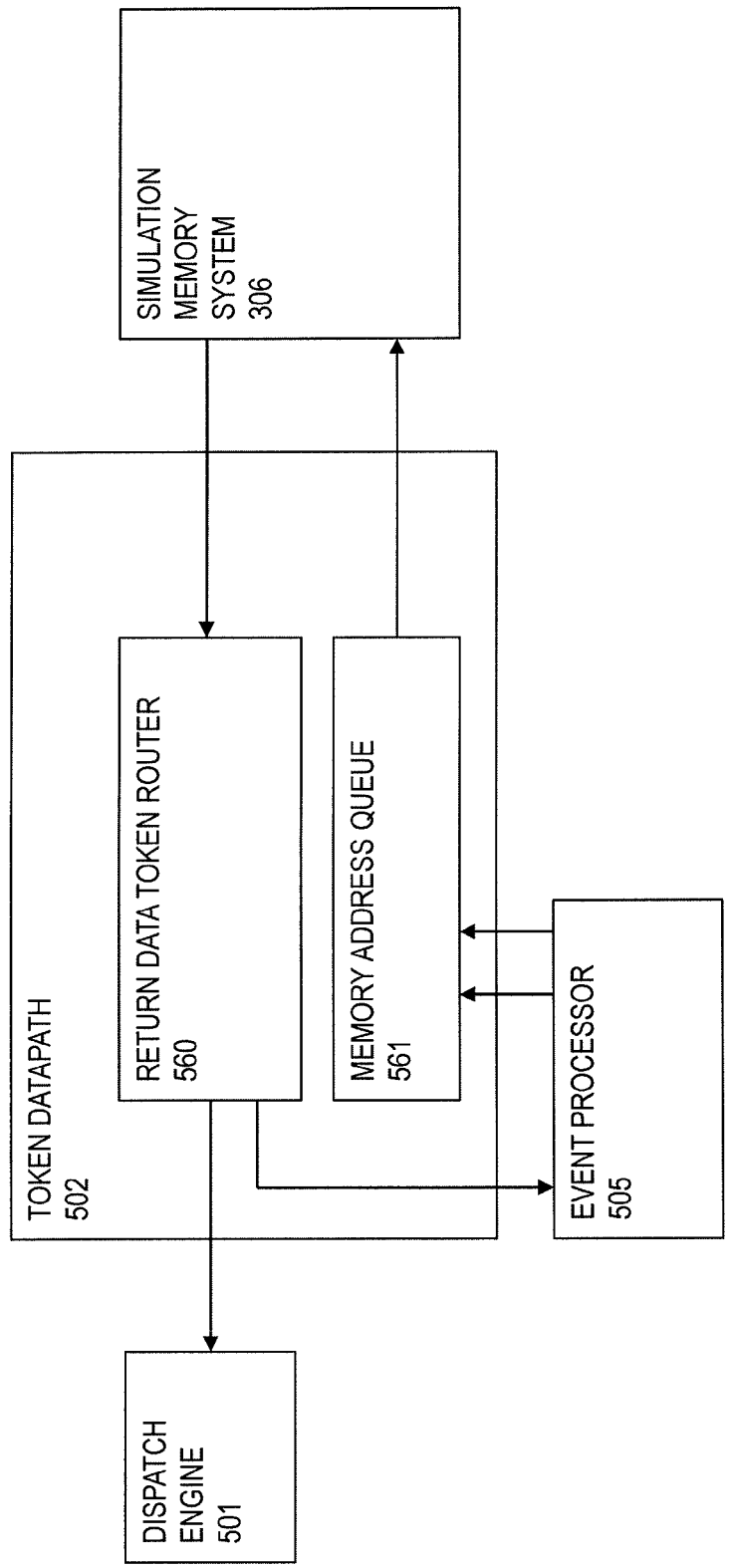
FIG. 5D is a block diagram of the token datapath, in accordance with disclosed embodiments.

FIG. 5D is a block diagram of the token datapath 502 which is used to queue up token memory addresses in a memory address queue 561 and buffer return data in a return data token buffer 560 until the tokens can be sent to the dispatch engine 501 or to the event processor 505. The token datapath 502 takes addresses out of the memory address queue 561 in FIFO order and sends them to the simulation memory subsystem 306. As described above, the simulation memory subsystem 306 interfaces with different memory devices that have varying latencies. Therefore, the data returned to the return data token router 560 will not necessarily be in the same order in which the addresses were presented to the simulation memory subsystem 306.

Figure 5E:
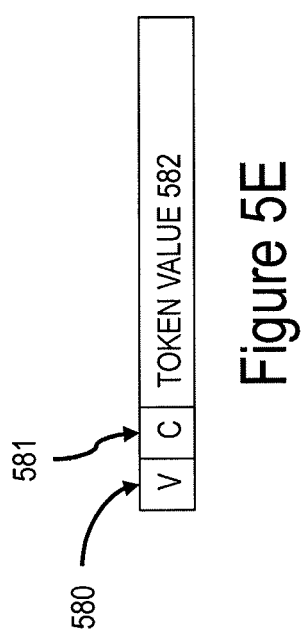
FIG. 5E is a diagram of a single entry in the dispatch engine datapath, in accordance with disclosed embodiments.

The dispatch engine 501 uses entries to keep track of what token values are running on which logic processors 317, 319. FIG. 5E is a block diagram of an entry used in the dispatch engine 501. The entry includes a token value 582. The valid bit 580 indicates whether the entry is valid. The compare bit 581 indicates whether the token value 582 should be compared when searching for a matching token. For example, thread tokens (as illustrated in FIG. 6A) require that the compare bit 581 be set to 1. On the other hand, NBA tokens (as illustrated in FIG. 6C) require that the compare bit 581 be set to 0.

Figure 5F:
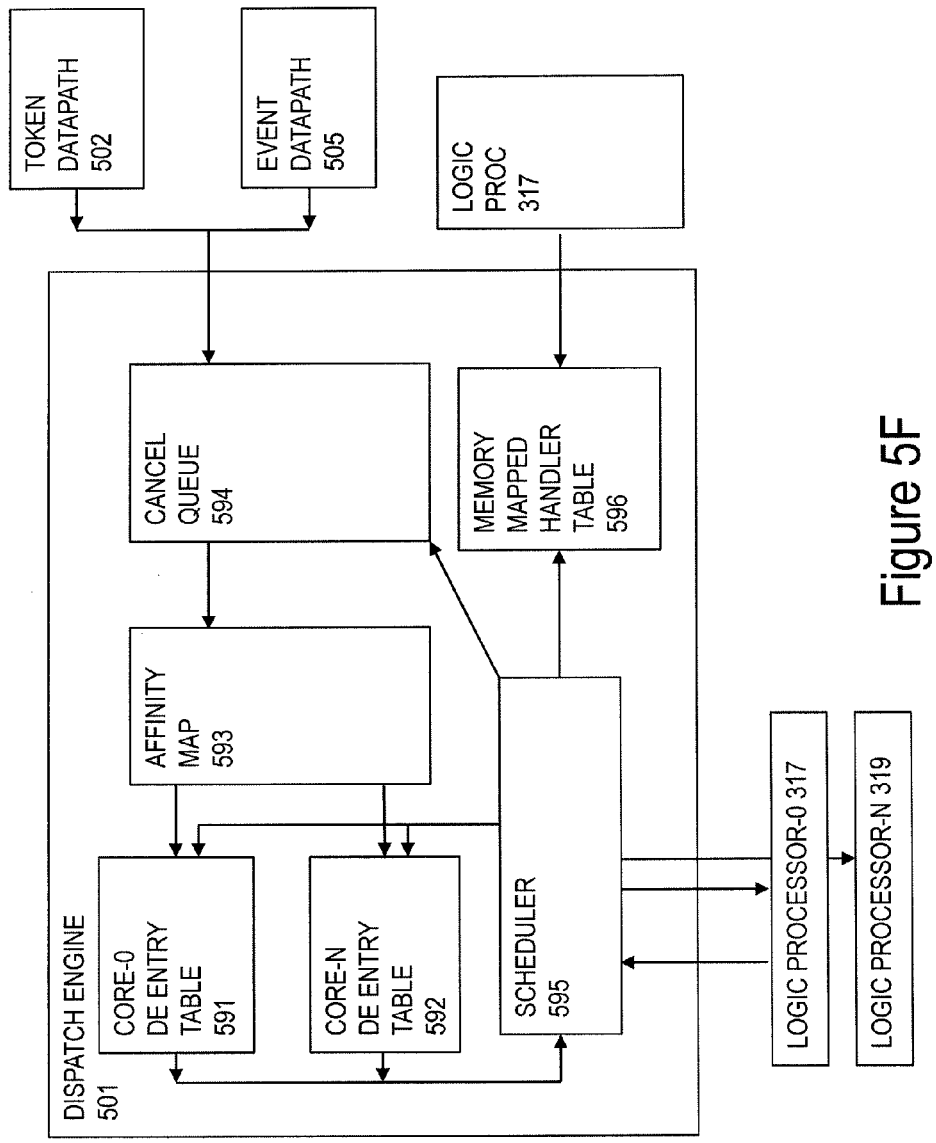
FIG. 5F is a block diagram of the dispatch engine, in accordance with disclosed embodiments.

FIG. 5F is a block diagram of the dispatch engine 501. The dispatch engine 501 includes a cancellation queue 594. The cancellation queue 594 contains tokens that were running at the time that the same token was received. Incoming tokens from token datapath 502 and from event processor 505 are compared against the values in the cancellation queue 594. If an exact match is found, the incoming tokens are thrown away. The cancellation queue 594 is necessary for an optimization in high performance simulation in which it is undesirable to wait for current running threads to complete before the next iteration of the event processor 505 is begun. An affinity map 593, also within the dispatch engine 501, determines which core or processor a token should be scheduled on. Some tokens, like thread tokens (illustrated in FIG. 6A), have affinity to one logic processor; other tokens, like NBA tokens (illustrated in FIG. 6C), have no affinity and can run on any logic processor and will select the logic processor that is least busy. The dispatched token is then sent to the dispatch engine entry tables 591, 592, as determined by the affinity map 593. The dispatch engine entry tables 591, 592 may accept the token entry, which involves updating the respective table local entry and forwarding the token to the scheduler for scheduling. The dispatch engine entry tables 591, 592 may also reject the token entry, which involves not updating the respective local entry but still forwarding the token to the schedule for placement in the cancellation queue 594. Tokens in the cancellation queue 594 are given priority when selecting a next token to process. The dispatch engine 501 may assert backpressure signals to the token datapath 502 and to the event processor 505 in order to prevent overflowing the cancellation queue 594.

A scheduler 595 looks at the token enumeration to determine how to schedule the operation with the logic processors 317, 319. Thread tokens (FIG. 6A) only require that the program counter of the thread be written into the memory mapped control registers of the logic processor 317. NBA tokens (FIG. 6C), in contrast, require writing an application programming interface (API) register of the logic processor along with the program counter of a pre-compiled kernel function that performs the simulation semantic operation. The handler table 596 contains a mapping between the token values and the program counter values of the given functions to be called. The scheduler 595 also keeps track of when the logic process has completed processing a token and clears the token value from the matching dispatch engine entry table 591 or 592.

Figure 5G:
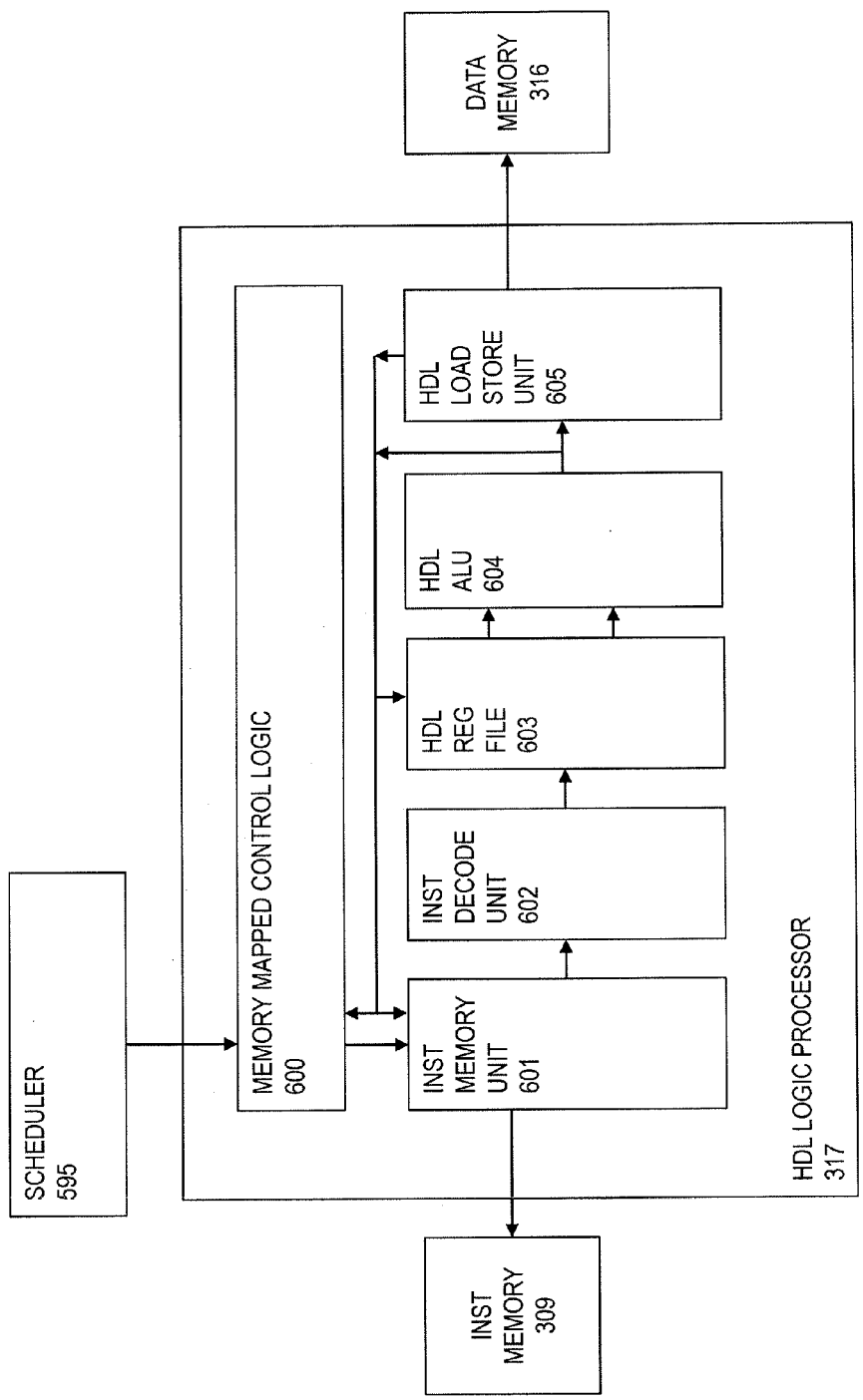
FIG. 5G is a block diagram of the logic processor, in accordance with disclosed embodiments.

FIG. 5G is a block diagram of a custom logic processor optimized for 4-state simulation data processing. The logic processor 317 contains memory mapped control logic 600, an instruction fetch unit (IFU) 601, an instruction decode unit (IDU) 602, an HDL 4-state enhanced register file 603, arithmetic logic unit (ALU) 604 and load-store unit (LSU) 605. The exemplary logic process contains 4 thread contexts, each comprised of a set of general purpose registers contained in register file 603 and a set of control registers contained in the control logic 600. Instruction execution is begun when the memory mapped control registers that represent the program counter of a thread of the logic processor 317 are written with a start address of a stream of instructions to be executed. The program counter sends the address to the instruction memory unit 601 which fetches the memory from the instruction memory system 309. Instruction memory unit 601 buffers those instructions in a cache memory that attempts to maintain a range of instruction memory data ahead and behind the current program counter, so that when control transfer instructions (branches) occur, the destination of the branch is already available and no additional time is spent waiting for the memory. The instruction decode unit 602 decodes the instructions coming from the instruction memory unit to determine which registers to be read from the HDL register file 603, and which arithmetic, logical, or memory operations must be performed by the ALU 604 or the LSU 605. The register file 603 contains a pair of registers for every index, which correspond with the Verilog semantically defined avalbits and bvalbits data structures illustrated in FIG. 5H and described below. The arithmetic logic unit 604 operates on the data from the register file using the HDL semantic arithmetic operations. The HDL load store unit 605 sends load and store requests to the data memory system and returns the data to the HDL register file. When returning load data from memory, the load store unit returns data to the register file along with type information to instruct the register file to fill the data in the avalbits and bvalbits for 4-state data or write the avalbits and clear the bvalbits for 2-state data. By using the load-store instructions to encode the type of the data when it is read into the register file 603, the instruction set of the HDL logic processor does not need to differentiate between the two seemingly different data types. Because 2-state operations are a subset of 4-state operations, the processor need only encode 4-state operations in order to execute both types of data.

Figure 5H:
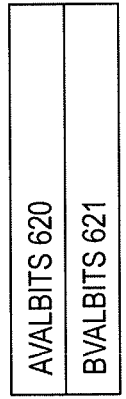
FIG. 5H is a block diagram of the Verilog register format, in accordance with disclosed embodiments.

The Verilog avalbits and bvalbits data structure is illustrated in FIG. 5H, which includes a block diagram of the Verilog register format. The format requires 2 bits of data to represent 1 4-state bit of a Verilog register. The avalbits 620 is used to encode the values "0" and "1" when the corresponding bit in bvalbits 621 is 0. The avalbits 620 is used to encode the values "X" and "Z" when the corresponding bit in bvalbits 621 is 1. Arithmetic and logic operations of a 2-state data are equivalent to a 4-state data for the values composed only of "0" and "1." These operations only differ for values of "X" and "Z." The processor is able to handle both types of data efficiently by using enhanced load and store instructions that are processed by the load store unit 605. When 2-state data is read from memory, the data is placed in the avalbits 620 and the bvalbits 621 value is set to 0. When 4-state data is read from memory, the data is placed in the avalbits 620 and the bvalbits 621. No additional instructions or additional instruction encoding is necessary to process 2-state or 4-state data, or to mix an operation with 1 or more 2-state operands with 1 or more 4-state operands.

Additional instructions to split up and recombine the avalbits 620 and bvalbits 621 data may be added to the instruction set architecture in order to have full control over constructing values.

The register file 603 also contains condition code bits which are standard in most processors. However, the condition code bits in the logic processor 317 represent tri-nary logic and encode the values true(1), false(0), and unknown ("x"). The logic processor 317 instruction set architecture also contains additional condition code comparison encodings for "is unknown" and "is not unknown," in addition to the more common "is true" and "is false" condition code comparisons.

Figure 5J:
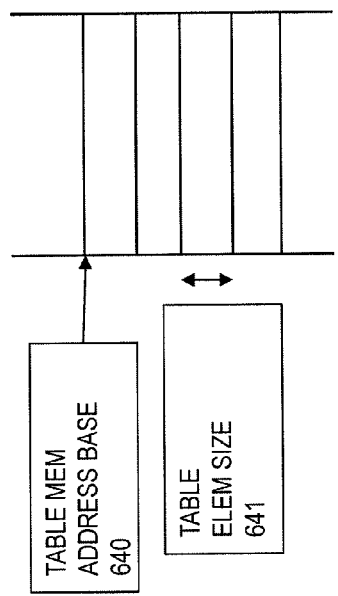
FIG. 5J is a block diagram of a memory table pointer and memory, in accordance with disclosed embodiments.
Figure 5I:
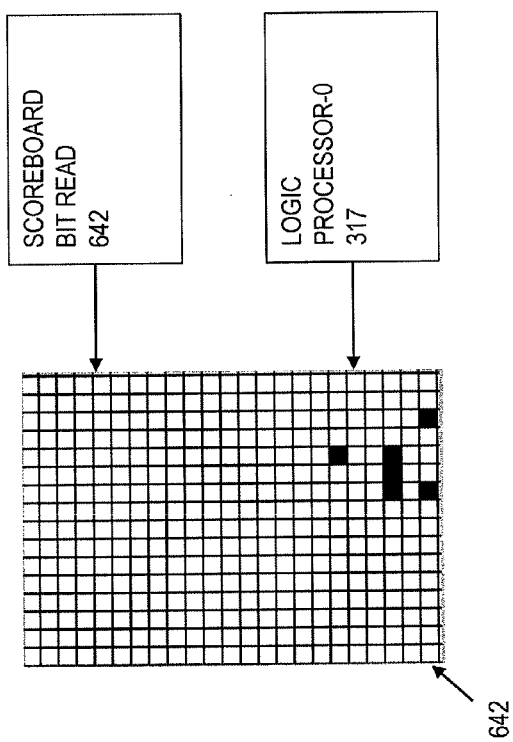
FIG. 5I is a block diagram of a simulation controller scoreboard, in accordance with disclosed embodiments.

FIG. 5I is a detailed block diagram of the scoreboards 542, 543, 544 and 545. The scoreboards of the simulation controller are all 1-bit scoreboards which store 1 bit of information at every index. The scoreboards have the advantage that they are compact: 16 MBs of scoreboard can be used to represent 128M unique indices. When a value is written to the scoreboard, the value is used as the index into the array of bits, and the bit is set to true. During the read portion, each set bit is returned as a stream of indices. This behaves like a mathematical set of integers, with constant insertion O(N) and constant lookup O(n). Additional bit storage may be used to represent a larger set of bits, one bit for every 256 bits, in order to reduce the search time to find the first bit set in the scoreboard. This scoreboard of scoreboard regions technique may be applied recursively to handle larger and larger scoreboards with predictable linear search times to find the first element. Subsequent elements would need to be searched linearly after the first bit is found, but the linear search to first element set is critical for performance of hardware.

The scoreboard provides a memory-mappable device that can be used to manage sets of information. The event processor 505 uses a scoreboard to track the notified events for a given event processor iteration. At the beginning of the iteration, the scoreboard is empty, signifying that no events have been notified. Events accumulate during the time the scoreboard is "active." When the translation unit 529 mapping are swapped, the scoreboard is used for "processing" and the index of the bits set is read out. Each of these indices corresponds to an event action that is stored in the event table in memory. Using the linear algebra of y=mx+b (where "y" represents a pointer to the notified event token, "m" represents the size of the table element 641 (in this case an event table entry), "x" represents an index coming from the scoreboard, and "b" represents the table address base 620), the scoreboard indices are able to be mapped to memory locations for event table semantic actions, as is illustrated in FIG. 5J.

Simulation tokens like NBA token (as illustrated in FIG. 6C, described below) provide a layer of indirection between the token and the memory that the token points to. This token indirection can be used for mapping of different scoreboard index ranges to different memory address ranges. Mathematically, this is represented as $\{0<=x<A|y_A=mx+b_A; A<=x<B|y_B=mx+b_B\}$, meaning that for a particular range A, use the offset OffsetA, and for a particular range B, use the offset OffsetB. In the simulation system, given different memory ranges map to different physical memories with different performance characteristics (i.e. latency, capacity), the HDL compiler is able to select different performance characteristics for events by assigning the events of the HDL design to different enumerated event numbers of the simulation controller.

The scoreboards contained within the resource allocator 506 are used in a different way than those used by the event processor 505. The resource allocator is configured to keep a set of available resources which will be encoded as bits set to 1 in the scoreboard. At the beginning of simulation time, a given memory range is divided up into fixed size chunks, the address of which is calculated using the y=mx+b. The software at the start of the simulation will set all the bits in the range to 1, indicating a given memory range resource is available. Software (running on logic process 317) or hardware (overflow queue controller 535) attempts to allocate a resource, like a block of memory to use for future overflow buffers, the scoreboard is read and the index of the bit that will be mapped to a memory location (using y=mx+b math) is returned. This bit being set to 0 in the scoreboard now indicates that a range of memory is allocated by device that reads the scoreboard (could be a logic process 317 or overflow queue controller 535). When the device or software is done using the resource, the index for the value is stored back into the scoreboard making it available for use again by other resources. The scoreboard can return a special index value to indicate that no bits are available, and the software or hardware reading this must be able to signal an out of resource error.

The token indirection, when used with the resource allocator, may allow for better resource utilization. For instance, if the overflow buffer resource allocator would run out of memory, it is foreseeable that software that handles the error could add more resources to the scoreboard if more resources were available but not mapped. Alternatively, the error handle could change the mapping function and copy the old data to a newer larger segment of memory and provide for more bits of allocation in the scoreboard. Using tokens as indirection allows for greater flexibility at the runtime to manage resources.

Hardware resource allocators are a significant performance advantage when compared to software based memory allocation which on a multi-threaded system requires locking shared memory. Hierarchical memory allocation with localized allocators trades off multi-threaded locking for less resources available to each localized allocator. The hardware based allocator does not suffer either of these performance limitations.

FIGS. 6A, 6B, 6C, and 6E are block diagrams of an exemplary simulation token encoding. The least significant bits of each token are used to decode the token type. Using a Huffman-like encoding, this method minimizes the encoding overhead for semantic tokens which require more data. FIG. 6A illustrates a thread token, as indicated by the thread suffix 611. The thread program counter 610 is included in the token. FIG. 6B illustrates an event token, as indicated by the event suffix 613. The event notification number 612 is also included in the token. FIG. 6C illustrates an NBA token with an NBA suffix 615 and an NBA buffer number 614 which represents an NBA memory region copy. FIG. 6E illustrates a static list token, as indicated by the Slist suffix 618. The static list token represents an static list of simulation tokens. The token includes a size value 616 and a memory offset value 617.

FIG. 6D is an exemplary software structure that stores a pointer to memory to be copied during the NBA phase. The FROM pointer 620 is a pointer to memory to be copied from, and the TO pointer 621 is a pointer to the memory to be copied to. The event number 622 is to be notified if the values at the memory pointed to by the FROM pointer 621 differ from the values at the memory pointed to by TO pointer 622. The size 623 of the memory to be copied is also included in the data structure.

FIG. 6F is an exemplary embodiment of a static list of fixed size. These structures are output from the HDL compiler 101 and are stored in the compiled HDL design 400 in the design kernel tables 422. These lists are created to represent a fan-out of a signal in the HDL design 100. An exemplary use of the static list token (FIG. 6E) would be to model a design signal from HDL design 100 that has more than one signal sensitive to it. The signal will have an event table entry that is activated when the signal changes. The associated event table entry will contain an static list token (FIG. 6E) when more than one semantic action (in the form of a token) is necessary to be processed as the result of the activation of the token. The static list token (FIG. 6E) points to static list data structure (FIG. 6F) that contains a list of tokens that become active when the event is notified.

An example of use of the described tokens and table is illustrated in FIGS. 4C-4G. FIG. 4C illustrates an exemplary Verilog design with 2 registers "a" and "b" and a wire "c," which is the combination of the registers "a" and "b." Three initial blocks are present in this design. The first initial block sets the value of "a" to 0. The second initial block sets the value of "b" to 0. The third initial block has a delay, and then sets the value of "a" to 1. The simulation of this design will terminate in one time slice, after no more events or threads are running.

FIG. 4D is an exemplary design symbol table 420 of the design shown in FIG. 4C as compiled by the Verilog HDL compiler 101. Each line contains a symbol name, the memory system that the symbol is stored in, and the memory location within that memory system. In the example of FIG. 4D, "d" refers to the data memory system 316, and "i" refers to the instruction memory system 309.

FIGS. 4E and 4F are exemplary portions of design kernel tables 422. FIG. 4E contains the event table which maps an enumerated event to a simulation processing token. The processing token for event[0] is an Slist token that instructs the simulation controller 308 to execute additional tokens (in this case, three more tokens), starting at offset 0 in the Slist table of FIG. 4F. An additional example of an Slist token is illustrated in FIG. 6E. The three tokens of the Slist table in FIG. 4F are each thread tokens of the type illustrated in FIG. 6A.

FIG. 4G is an exemplary assembly code of the design instruction memory 421 of the design illustrated in FIG. 4C, as compiled by the Verilog HDL compiler 101. The figure contains four code segments that each represent a statement of the exemplary Verilog design of FIG. 4C. The first assembly sequence starting at 0x100 loads an immediate value 0 into a register "$4" of a register file 603 (as described below). The next instruction loads from the data memory system 316 for the symbol "a" into the register file 603. The next instruction compares to see if the value of the symbol "a" has changed, and sets the condition code bit "?1" if the values are not equal. The next instruction stores the register value, contained in the register file 603, to the memory system 316 only if the condition code bit "?1" is true. This is a special store instruction, as denoted by the ".x," to indicate to the memory subsystem that the data that is stored should be read from the avalbits 620 and bvalbits 621 portions of the register file 603. The next instruction stores the value 1 to the "EVENT_S-BRD," only if the condition code bit "?1" is true. This store is an exemplary method for notifying an event in the scoreboard pointed to by an active event scoreboard index 802. The next instruction terminates the thread of execution, which causes a memory mapped control logic 600 of the HDL logic processor 317 to notify the scheduler 595 of the dispatch engine 501 that the processing resource is available.

The next set of instructions starting at address 0x120 performs the same initialization and notification of the same event, only this time for the value of the symbol "b." The third set of instructions starting at 0x140 is an exemplary representation of the compiled code of the initial block in the exemplary Verilog design of FIG. 4C that contains a delay control. The instructions load an immediate value thread token (e.g., the token of FIG. 6A) that starts at the address 0x180, which contains the instructions for the continuation of the thread after the delay of 1 has occurred. This instruction stores the thread token to the memory mapped #1 Queue 346. Tokens and events are 2-state data and use store word instructions, encoded as "sw," at addresses 0x110, 0x130, 0x144, and 0x190. After the simulation has advanced simulation time register 344 to the value of 1, the thread token that contains the address of 0x180 will be in the executed.

The final set of instructions starting at address 0x200 perform the combinational logic evaluation for the signal "c" of exemplary design. The sequence of instructions loads the data values for "a" and "b" and performs an logical-or operation on the two values, and places the result in register "$6." The instruction sequence then reads the old value for the symbol "c" from memory and loads it into register "$7." The next instruction compares to see if there is any change to the value of the signal "c" and sets the condition code "?1" if the value has changed. The next instruction stores out the 4-state data for signals "c" from register "$6" into the data memory system, if the condition code "?1" is true, indicating that the value has changed. The next instruction terminates the thread of execution.

Figure 7A:
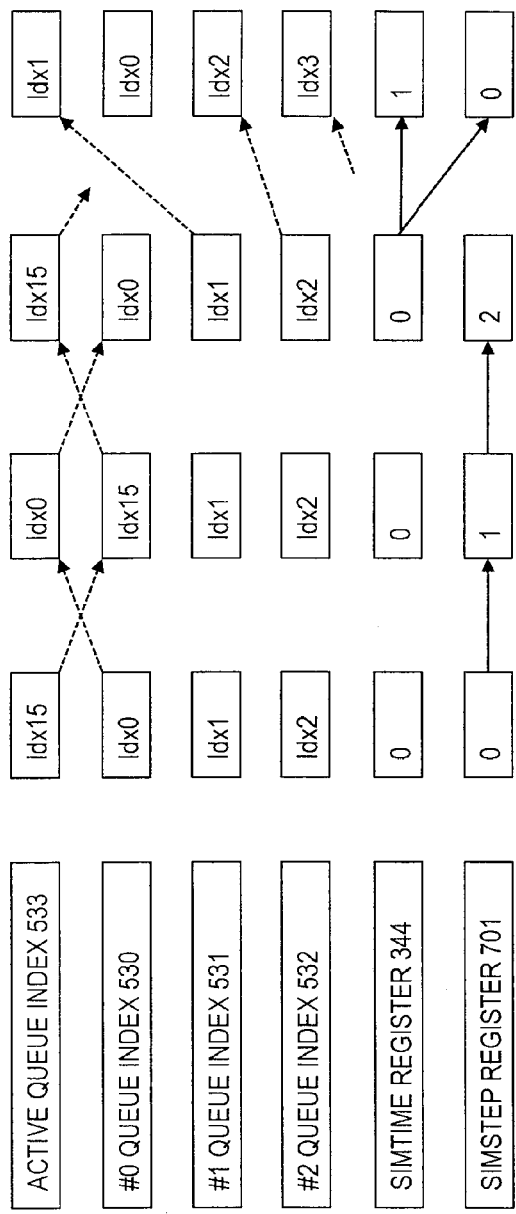
FIG. 7A is a timeline of the register values of the time wheel as simulation time advances by time step, and time increment, in accordance with disclosed embodiments.

FIG. 7A is a diagram of the simulation controller register values as the simulation time proceeds. The active queue index 533, #0 queue index 530, #1 queue index 531, #2 queue index 532, simulation time register 344, and simulation step register 701 values are shown over a series of state transitions initiated by the control logic 503. The diagram illustrates the technique of swapping indices in a control register mapping in order to perform the simulation semantic operations of moving between regions of the Verilog event regions (as illustrated in FIG. 2A) and of the Verilog time wheel (as illustrated in FIG. 2C). As an example, at decision point 203 in FIG. 2A, the simulation kernel is out of events to process and is ready to move to the inactive (#0) region 204. The control logic 503 of the simulation controller 308 initiates the state transfer by sending a command to the advance time controller 536 to advance to the inactive (#0) region 204. The advance time controller 536 swaps the value of the index of the active queue index 533 with the index of the inactive queue 530 and increments the simulation time step register 701. Since the simulation only ever changes regions when the queue mapped by the active queue index 533 is empty, it is safe to swap this in for any empty queue.

The next simulation time step operation is identical to the first.

The final simulation time increment operation illustrates how the advance time controller 536 must rotate the indices of the time wheel in order to preserve the simulation kernel semantics. When simulation time register 344 was at 0, the #2 queue index 532 pointed to "Idx2," a queue that holds events for simulation time 2. In the next time slice, after simulation time register 344 was incremented to 1, the #1 queue index 531 pointed to "Idx2," the queue holds events for simulation time 2.

Figure 7B:
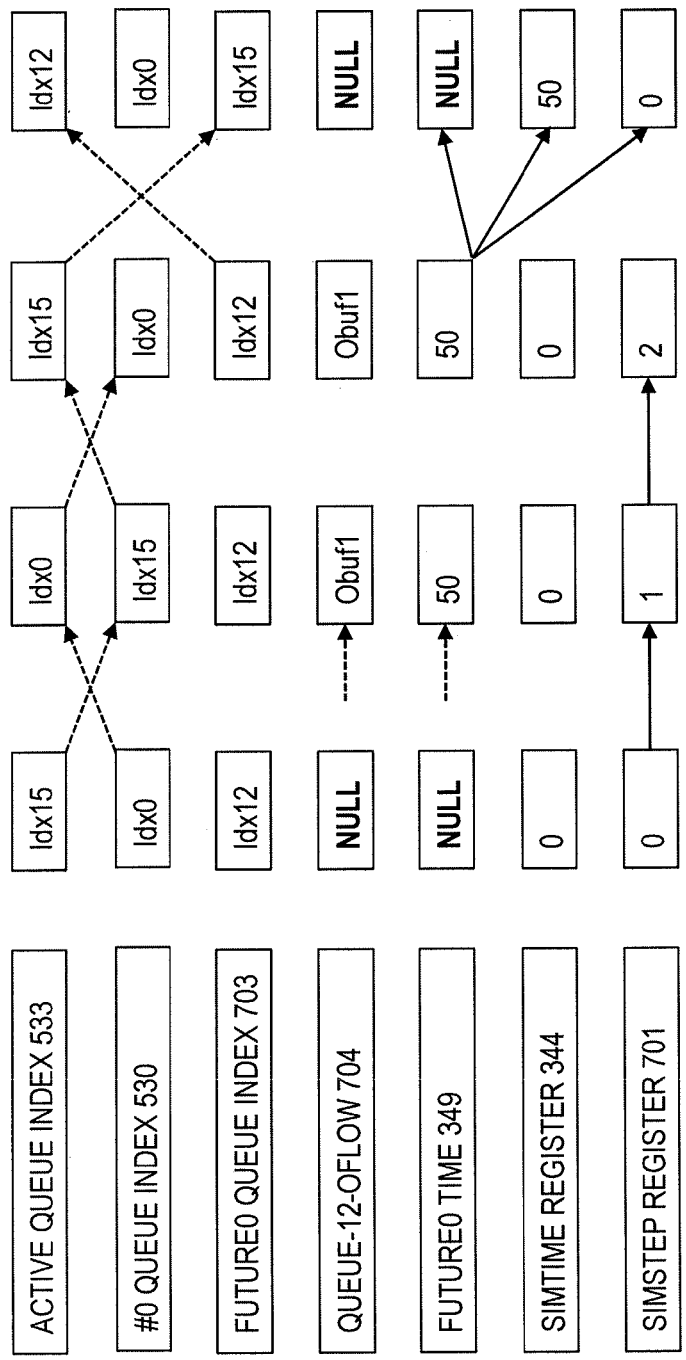
FIG. 7B is a timeline of the register values of the time wheel as simulation time jumps forward, in accordance with disclosed embodiments.

FIG. 7B is a diagram of the simulation controller register values as the simulation time moves beyond the size of the time wheel. The active queue index 533, #0 queue index 530, future0 queue index 703, overflow queue 12 pointer 704, future0 time value 349, simulation time register 344, and simulation step register 701 values are shown over a series of state transitions initiated by the control logic 503. The first transition to simulation time step 701 value of "1" is the same as in FIG. 7A. During this time step, and in this example, a thread schedules an event for time 50 which is outside the range of memory mapped time windows. Software library routines are called by the HDL compiler generated code 421 that is running on logic processor 317 to handle simulation kernel semantic operations that are not directly mapped into hardware registers. The software routine will allocate a spill buffer from the resource allocator 503, which is called "Obuf1" and which will contain the tokens to be processed at time 50. The software routine then stores the delayed event token into that buffer. The software routine then determines that 50 is the next nearest simulation time which has a buffer already allocated. The software routine then writes the future 0 time register value with 50 indicating the time that these event tokens should become active, and places the buffer pointer "Obuf1" into the memory mapped overflow register for future 0 time queue. The next simulation time step demonstrates that the simulation may advance time steps, without disturbing these pending future queue values.

Upon completing simulation time 0, simulation step 2, the control logic determines that the next nearest queue is the future0 pending queue and swaps-in the index for this time queue with the empty active time queue. When this time queue becomes active, the overflow pointer is used to read the data from memory, and the time wheel datapath returns the allocated space to the resource allocator.

It should be noted, the processors used and described above can include processors with both traditional RISC cores mixed with logic cores. Also, DSP or floating point optimized cores to handle the analog portion of an ADMS (Analog Digital Mixed Signal) simulation would be a logical extension to the current hardware architecture.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A simulation system for simulating a hardware description language (HDL), comprising:
    a controller that comprises:
    a time wheel module comprising a plurality of physical queues to which virtual queues that represent an HDL simulator description are mapped; and
    control logic which controls the mapping of the virtual queues to physical queues to represent an advancement of time; and
    a logic processor that comprises:
    an instruction fetch unit configured to retrieve and buffer a plurality of simulation instructions in response to the controller;
    an instruction decode unit configured to receive and decode instructions from the instruction fetch unit;
    a four-state register file comprising a plurality of pairs of registers to load data in accordance with the decoded instructions, each register of a pair corresponding to a Verilog data structure; and
    an arithmetic logic unit configured to use hardware device language semantic arithmetic, logical, and comparison operations on data in the pairs of registers.

2. The simulation system of claim 1, further comprising a plurality of memory devices for storing HDL simulation information.

3. The simulation system of claim 2, wherein the plurality of memory devices include devices for HDL design data, HDL design instructions and HDL simulation kernels.

4. The simulation system of claim 3, wherein both internal and external memory devices are used for storing at least one of: HDL design data, HDL design instructions and HDL simulation kernels.

5. The simulation system of claim 4, wherein the internal and external memory devices include devices of different latencies and bandwidths.

6. The simulation system of claim 5, wherein the internal and external memory devices are configured to store information based on the frequency of access to the information.

7. The simulation system of claim 5, wherein the internal and external memory devices are configured to store information based on the size of data structures being stored.

8. The system of claim 1, wherein the time wheel module comprises:
   a translation unit with an array of queue indices which translate the physical queues with the virtual queues; and
   an advance time control block that simulates the advancement of time by writing to the array of queue indicies and changing the association between the physical queues and the virtual queues.

9. The system of claim 1, wherein the advance time control block receives instructions from the control logic.

10. The system of claim 1, wherein the timewheel module comprises:
   a plurality of overflow queue registers, each of the overflow queue registers associated with one of the physical queues,
   a queue overflow controller configured to request a block of memory from a resource allocator when one of the physical queues is filled above a threshold value, write data to the block of memory, and write a pointer to the block of memory in one of the plurality of overflow queue registers.

11. The system of claim 1, wherein the Verilog data structures to which the pairs of registers correspond are the avalbits and bvalbits data structures.

* * * * *